(12) United States Patent
Inoue et al.

(10) Patent No.: US 8,202,576 B2
(45) Date of Patent: Jun. 19, 2012

(54) METHOD OF FORMING METAL FILM

(75) Inventors: Masaaki Inoue, Kanagawa (JP); Tetsunori Matsumoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 477 days.

(21) Appl. No.: 12/494,298

(22) Filed: Jun. 30, 2009

(65) Prior Publication Data

US 2010/0080893 A1    Apr. 1, 2010

(30) Foreign Application Priority Data

Sep. 30, 2008 (JP) ................. 2008-254717

(51) Int. Cl.
*B05D 3/00* (2006.01)

(52) U.S. Cl. ........ 427/304; 427/305; 427/306; 427/437; 427/438; 427/443.1; 427/97.9; 427/99.5; 205/183; 205/184; 205/187; 205/188

(58) Field of Classification Search ............... 427/97.9, 427/99.5, 304, 437, 443.1; 205/84
See application file for complete search history.

(56) References Cited

U.S. PATENT DOCUMENTS

2009/0214876 A1 * 8/2009 Kano et al. ................. 428/423.1

FOREIGN PATENT DOCUMENTS

JP          58-196238 A       11/1983
WO    WO 2008050715 A1 *    5/2008

OTHER PUBLICATIONS

En Tang Kang,Yan Zhang,"Advanced Materials",20,p. 1481-p. 1494.
N.Inagaki,S.Tasaka,M.Matsumoto,"Macromolecules",29,p. 1642-p. 1648.

* cited by examiner

*Primary Examiner* — Erma Cameron
(74) *Attorney, Agent, or Firm* — SOLARIS Intellectual Property Group, PLLC

(57) ABSTRACT

A method of forming a metal film, the method including: (a) forming a primer layer on a substrate by applying a first polymer including a unit having a cyano group in a side chain; (b) forming a polymer layer on the surface of the primer layer by applying a second polymer, the second polymer having a functional group that interacts with an electroless plating catalyst or a precursor thereof and a polymerizable group; (c) applying the electroless plating catalyst or the precursor thereof to the polymer layer; and (d) forming a metal film on the polymer layer by performing electroless plating.

11 Claims, No Drawings

METHOD OF FORMING METAL FILM

CROSS-REFERENCE TO RELATED APPLICATION

This application claims priority under 35 USC 119 from Japanese Patent Application No. 2008-254717 filed Sep. 30, 2008, the disclosure of which is incorporated by reference herein.

BACKGROUND OF THE INVENTION

1. Field of the Invention

The present invention relates to a method of forming a metal film.

2. Description of the Related Art

A metal film that is formed on a substrate is used for wiring or the like of various electric appliances by etching the same in a patterned manner. In a metal film formed on a substrate (metal substrate), the adhesion of the metal film to the substrate has been improved by an anchoring effect that is obtained by roughening the surface of the substrate. As a result, there has been a problem in that when the metal film is used for electric wiring, high-frequency characteristics of the same may deteriorate due to the interface portion of the metal film with the substrate being rough. Further, in order to perform surface roughening of the substrate, there is a need to conduct such a complicated step as treating the substrate with a strong acid such as chromic acid. Therefore, improvements in the above process have been demanded.

In order to address the aforementioned problems, Japanese Patent Application Laid-Open (JP-A) No. 58-196238 discloses a method of forming a metal film by applying a coating composition containing a monomer to a substrate, introducing a surface graft polymer onto the substrate by irradiating the coating composition with electron beams or UV rays, and then performing electroless plating. According to this method, a metal film can be formed without roughening the surface of the substrate. However, since this method includes a step of forming a graft polymer by applying a monomer in the form of a liquid to a substrate and irradiating the monomer in the form of a liquid with electron beams or UV rays, problems in handling in manufacturing may occur. Further, detailed investigation concerning the actual state of the substrate surface or adhesion between the substrate and the metal layer has not yet been carried out for this method.

As a method of improving adhesiveness of a metal layer with respect to a substrate by introducing a graft polymer to the substrate surface, En Tang Kang and Yan Zhang, "Advanced Materials", 20, pp. 1481-1494 and N. Inagaki, S. Tasaka and M. Matsumoto, "Macromolecules", 29, pp. 1642-1648 disclose a method of improving adhesiveness of a copper layer with respect to a polyimide substrate. This method includes subjecting a polyimide substrate to a plasma treatment in order to introduce a polymerization initiation group onto the surface of the polyimide surface, and then introducing a graft polymer onto the polyimide substrate by polymerizing a monomer from the polymerization initiation group, thereby forming a metal layer (copper layer) on the graft polymer. However, since this method includes such a large-scale process as a plasma treatment that consumes a great amount of energy, there has been a demand for a more convenient method.

SUMMARY

An aspect of the present invention provides a method of forming a metal film, the method comprising:
(a) forming a primer layer on a substrate by applying a first polymer including a unit having a cyano group in a side chain;
(b) forming a polymer layer on the surface of the primer layer by applying a second polymer, the second polymer having a functional group that interacts with an electroless plating catalyst or a precursor thereof and a polymerizable group;
(c) applying the electroless plating catalyst or the precursor thereof to the polymer layer; and
(d) forming a metal film on the polymer layer by performing electroless plating.

DETAILED DESCRIPTION OF THE INVENTION

In view of the above circumstances, the invention aims to provide a method of forming a metal film by a simple process in which consumption of a large amount of energy can be avoided and a metal film having excellent adhesiveness with respect to a substrate can be formed, even when the surface of the substrate is less roughened.

The present invention was made based on the findings that by forming a primer layer on a substrate using a polymer having a cyano group in a side chain, it is possible to obtain a metal film that exhibits excellent adhesiveness with respect to the substrate even when the surface of the substrate is less roughened.

Specifically, the method of forming a metal film of the invention includes (a) forming a primer layer on a substrate by applying a first polymer including a unit having a cyano group in a side chain to the substrate; (b) forming a polymer layer on the surface of the primer layer by applying (directly chemically bonding) a second polymer to the primer layer, the second polymer having a functional group that interacts with an electroless plating catalyst or a precursor thereof and a polymerizable group; (c) applying the electroless plating catalyst or the precursor thereof to the polymer layer; and (d) forming a metal film on the polymer layer by performing electroless plating.

The method may further include (e) performing electroplating after the electroless plating.

The metal film can be formed in a patterned manner by applying energy in a patterned manner to the polymer layer that was formed in step (b), and then developing the same.

In order to improve the adhesiveness of the metal film with respect to the substrate, energy may be applied to the metal film that was formed in step (d).

The polymer including a unit having a cyano group in a side chain preferably includes a polymer having a unit represented by the following formula (1).

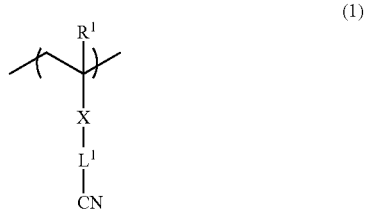

In formula (1), $R^1$ represents a hydrogen atom or an alkyl group that may be substituted or unsubstituted; X represents a single bond, a divalent organic group that may be substituted or unsubstituted, an ester group, an amide group, or an ether group; $L^1$ represents a divalent organic group that may be substituted or unsubstituted.

The application amount of the primer layer is preferably 0.1 mg/m² to 10 mg/m², in terms of solid content of the polymer including a unit having a cyano group in a side chain.

Preferable examples of the polymer having a functional group that interacts with an electroless plating catalyst or a precursor thereof and a polymerizable group include a copolymer that includes a unit represented by the following formula (a) and a unit represented by the following formula (b).

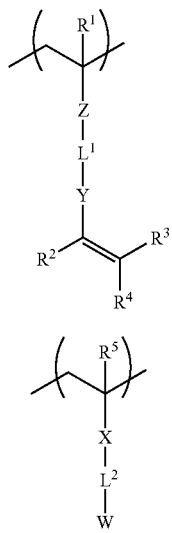

(a)

(b)

In formula (a) and formula (b), $R^1$ to $R^5$ each independently represent a hydrogen atom or an alkyl group that may be substituted or unsubstituted; X, Y and Z each independently represent a single bond, a divalent organic group that may be substituted or unsubstituted, an ester group, an amide group or an ether group; $L^1$ and $L^2$ each independently represent a divalent organic group that may be substituted or unsubstituted; and W represents a functional group that interacts with an electroless plating catalyst or a precursor thereof.

Other examples of the polymer having a functional group that interacts with an electroless plating catalyst or a precursor thereof and a polymerizable group include a polymer having a non-dissociative functional group that ineracts with an electroless plating catalyst or a precursor thereof, a radical polymerizable group and an ionic polar group. Preferable examples of such a polymer include a copolymer that includes a unit represented by the following formula (A), a unit represented by the following formula (B) and a unit represented by the following formula (C).

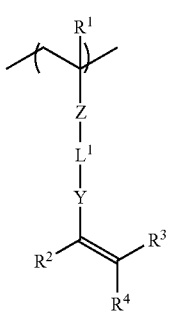

(A)

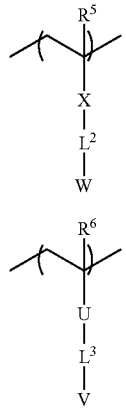

(B)

(C)

In formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a divalent organic group that may be substituted or unsubstituted; W represents a functional group that interacts with an electroless plating catalyst or a precursor thereof; and V represents an ionic polar group.

The metal film formed by the aforementioned method preferably has an adhesiveness with respect to the substrate via the polymer layer and the primer layer of 0.2 kN/m.

In the invention, the metal film may be formed in a patterned manner by forming the primer layer or the polymer layer in a patterned manner, or by etching the metal film that was formed by the aforementioned method in a patterned manner.

The polymer layer preferably has a portion containing particles of at least one of the electroless plating catalyst or a metal that has been precipitated by the electroless plating, the portion extending from the interface of the polymer layer and the metal film to a depth of 0.05 µm or more in a direction toward the substrate.

Although the function of the invention is not clear, it can be presumed as follows.

Specifically, since a primer layer is formed on the substrate from a polymer including a unit having a cyano group in a side chain, this primer layer can be tightly adhered to a substrate (when it is made of a resin), due to excellent wettability and affinity with respect to the resin substrate.

Further, a polymer layer is formed on the primer layer by applying and drying a polymer having a functional group that interacts with an electroless plating catalyst or a precursor thereof and a polymerizable group. This polymer layer exhibits excellent adhesiveness with respect to the substrate via the primer layer due to compatibility and affinity of the polymers, and has a receptivity to the plating catalyst. Since this polymer has a polymerizable group (preferably a radical polymerizable group), it is possible to form a polymer layer that is firm due to its crosslinked structure and is highly receptive to a plating catalyst or a precursor thereof.

Since the electroless plating catalyst can be efficiently adsorbed to the polymer layer having excellent adhesiveness with respect to the substrate and strength, a hybrid state of metal and resin is formed at an interface of the metal film and the polymer layer. It is presumed that due to this hybrid state, the metal film can be tightly adhered to the substrate via the polymer layer and the primer layer, even when the substrate has a smooth surface.

In the following, the invention is explained in detail.

<Metal Film>

The metal film obtained by the method of the invention is formed by applying an electroless plating catalyst or a precursor thereof to a polymer layer formed from a polymer having a functional group that interacts with the electroless plating catalyst or a precursor thereof and a polymerizable group, and then performing electroless plating. Namely, the metal film according to the invention can be formed on the substrate even when it has a smooth surface, without performing surface roughening of the substrate.

The adhesiveness of the metal film obtained by the method of the invention is preferably 0.2 kN/m or more, more preferably about 0.2 to 2.0 kN/m. A metal film formed by a conventional method, which includes surface roughening of a substrate, typically has an adhesiveness of about 0.2 to 3.0 kN/m. Therefore, adhesiveness of the metal film according to the invention can be considered to be tolerable enough for practical applications.

Further, in the invention, the polymer layer preferably has a portion containing particles of at least one of an electroless plating catalyst or a metal that has been precipitated by electroless plating, the portion extending from the interface of the polymer layer and the metal film to a depth of 0.5 μm or more in a direction toward the substrate. In the invention, it is possible to form a polymer film that exhibits excellent adhesiveness with respect to a metal film on a substrate such that the polymer film is tightly adhered to the substrate in a simple process, by providing a primer layer formed from a polymer including a specific unit between the polymer layer and the substrate.

When the polymer layer contains the aforementioned particles, the particles may be dispersed in the polymer layer such that the density of the same at the side of the interface with the metal film is relatively higher than other portions. In view of exhibiting the adhesiveness of the polymer layer with respect to the substrate, the portion in the vicinity of the interface of the polymer layer and the metal film preferably contains the particles at an amount of 25% by volume, more preferably 40% by volume, and particularly preferably 50% by volume.

Further, the portion containing the particles at high density preferably extends from the interface of the polymer layer and the metal film in a direction toward the substrate to a depth of 0.05 μm or more, more preferably 0.1 μm or more, further preferably 0.2 μm or more, and particularly preferably 0.3 μm or more.

In the invention, the polymer layer is formed from a polymer that has a polymerizable group, in addition to a functional group capable of adsorbing a plating catalyst. From the viewpoint of receptivity to the plating catalyst, the polymer preferably has an ionic polar group.

Typically, a metal pattern having an excellent high-frequency characteristic can be obtained by forming a metal film on a substrate having a surface that is less roughened, and then etching the metal film in a patterned manner. The high-frequency characteristic here refers to a reduced transmission loss, more specifically a reduced conductor loss.

However, in a conventional method, since sufficient adhesiveness of the metal film with respect to the substrate cannot be achieved when the surface of the substrate is not rough enough, the surface of the substrate is subjected to a roughening treatment of various kinds prior to forming the metal film. Consequently, a conventional substrate typically has a surface with a roughness of 200 nm or more to which a metal film is formed.

On the other hand, in the method of the invention, a metal film that exhibits an excellent adhesiveness can be obtained even when the surface of the substrate is less roughened, by providing a primer layer on the surface of the substrate that improves the adhesiveness of a polymer layer with respect to the substrate, the polymer layer having an excellent adhesiveness with respect to the metal film. Therefore, a metal film or a metal pattern having an excellent high-frequency characteristic can be obtained.

The metal film produced in accordance with the method of the invention can be used for an electromagnetic ray-shielding film or the like. Further, by performing patterning of the metal film by etching, the obtained metal pattern can be used for semiconductor chips, semiconductor packages, electrical wiring boards, FPCs, COFs, TABs, antennas, multilayer wiring boards, mother boards, or the like.

The metal film as mentioned above can be produced by the method of forming a metal film of the invention, as described below.

<Method of Forming Metal Film>

The method of forming a metal film of the invention includes (a) forming a primer layer on a substrate by applying a first polymer including a unit having a cyano group in a side chain to the substrate; (b) forming a polymer layer on the surface of the primer layer by directly chemically bonding a second polymer to the primer layer, the second polymer having a functional group that interacts with an electroless plating catalyst or a precursor thereof and a polymerizable group; (c) applying the electroless plating catalyst or the precursor thereof to the polymer layer; and (d) forming a metal film on the polymer layer by performing electroless plating. In the following, details of steps (a) to (d) are described.

Step (a): Formation of Primer Layer

In step (a), a primer layer is formed on a substrate by applying a polymer including a unit having a cyano group in a side chain (hereinafter, referred to as "cyano group-containing polymer" sometimes).

<Substrate>

The substrate according to the invention is a member onto which a primer layer is formed.

The substrate used in the invention is preferably a plate-shaped, dimensionally stable object. Examples thereof include a sheet of paper, a sheet of paper laminated with a resin (such as polyethylene, polypropylene or polystylene), a sheet of a metal (such as aluminum, zinc or copper), a film of a resin (such as cellulose diacetate, cellulose triacetate, cellulose propionate, cellulose butyrate, cellulose acetate, cellulose nitrate, polyethylene terephthalate, polyethylene, polystyrene, polypropylene, polyvinyl acetal, polyimide, epoxy, bismaleimide resin, polyphenylene oxide, liquid crystal polymer or polytetrafluoroethylene), and a sheet of paper or plastic film on which a metal as mentioned above is laminated or evaporated.

The substrate containing a polyimide having a polymerization initiation site in the skeleton thereof, as described in paragraphs [0028] to [0088] of JP-A No. 2005-281350, may also be used for the substrate.

The metal film in the pattered form obtained by the method of forming a metal film of the invention may be applied to a semiconductor package, various kinds of electrical wiring boards, and the like. When the metal film is used in such applications, it is preferable to use a substrate including an insulating resin, as shown below. Specifically, it is preferable to use a substrate formed from an insulating resin, or a substrate having a layer formed from an insulating resin on a base material.

The substrate formed from an insulating resin or the layer formed from an insulating resin may be formed using a known insulating resin composition. The insulating resin composition may include an additive of various kinds in combination with the resin as a main component, according to purposes. For example, a polyfunctional acrylate monomer may be added for the purpose of increasing the strength of the insulating layer, or inorganic or organic particles may be added for the purpose of increasing the strength of the insulating layer and improving the electrical properties thereof.

Here, the "insulating resin" according to the invention means a resin having an insulating property that is within a tolerable level for use in known insulating films or insulating layers. Therefore, the resin does not have to be completely insulating, as long as it has an insulating property that satisfies the requirements according to purposes.

The insulating resin may be a thermosetting resin, a thermoplastic resin, or a mixture thereof. Specifically, examples of the thermosetting resin include epoxy resins, phenolic resins, polyimide resins, polyester resins, bismaleimide resins, polyolefin-based resins, isocyanate-based resins, and the like.

Examples of the epoxy resins include cresol novolac type epoxy resins, bisphenol A type epoxy resins, bisphenol F type epoxy resins, phenol novolac type epoxy resins, alkylphenol novolac type epoxy resins, biphenol F type epoxy resins, naphthalene type epoxy resins, dicyclopentadiene type epoxy resins, epoxides of a condensate formed from a phenol and an aromatic aldehyde having a phenolic hydroxyl group, triglycidyl isocyanurate, alicyclic epoxy resins, and the like. These resins may be used alone, or may be used in combination of two or more species. By including the insulating resin as mentioned above, excellent heat resistance or the like may be obtained.

Examples of the polyolefin-based resins include polyethylene, polystyrene, polypropylene, polyisobutylene, polybutadiene, polyisoprene, cycloolefin-based resins, copolymers of these resins, and the like.

Examples of the thermoplastic resins include phenoxy resins, polyether sulfone, polysulfone, polyphenylene sulfone, polyphenylene sulfide, polyphenyl ether, polyether imide, and the like.

Other thermoplastic resins include 1,2-bis(vinylphenylene)ethane resin, or a modified resin obtained from the 1,2-bis(vinylphenylene)ethane resin and a polyphenylene ether resin (described in Satoru Amou et al., Journal of Applied Polymer Science, Vol. 92, pp. 1252-1258 (2004)), liquid crystal polymers (for example, VECSTAR, trade name, manufactured by KURARAY CO., LTD.), fluororesins (PTFE), and the like.

The thermoplastic resin and the thermosetting resin may be used in combination for the purpose of compensating the defects of each resin to achieve better effects. For example, since a thermoplastic resin such as polyphenylene ether (PPE) has low resistance to heat, alloying with a thermosetting resin or the like may be carried out, such as alloying of PPE with epoxy or triallyl isocyanate, or alloying of a PPE resin to which a polymerizable functional group has been introduced with another thermosetting resin. Further, a cyanate ester is a resin that exhibits the most excellent dielectric properties among the thermosetting resins, but is hardly used alone and mainly used as a modified resin of epoxy resins, maleimide resins, thermoplastic resins and the like. Details of these resins are described in "Electronic Technology" No. 2002/9, p. 35. Furthermore, a mixture containing an epoxy resin and/or a phenolic resin as a thermosetting resin, and a phenoxy resin and/or polyethersulfone (PES) as a thermoplastic resin, may also be used for the purpose of improving dielectric properties.

The insulating resin composition may include a compound containing a polymerizable double bond in order to promote crosslinking reaction. Specific examples of the compound include an acrylate or methacrylate compound, particularly preferably a polyfunctional acrylate or methacrylate compound. Other applicable compounds containing a polymerizable double bond include those obtained by subjecting a part of a thermosetting resin or a thermoplastic resin (for example, an epoxy resin, a phenolic resin, a polyimide resin, a polyolefin resin, or a fluororesin) to a (meth)acrylation reaction using methacrylic acid, acrylic acid or the like.

A composite of a resin and other component may also be used as the insulating resin composition for the purpose of reinforcing the properties of a resin film, such as mechanical strength, heat resistance, weather resistance, flame retardancy, water resistance or electrical properties. Examples of the material that may be used for producing a composite include paper, glass fiber, silica particles, phenolic resins, polyimide resins, bismaleimide triazine resins, fluororesins, polyphenylene oxide resins, or the like.

Further, the insulating resin composition may be compounded with, if necessary, one or more kinds of filler for use in general resin materials for wiring boards. Examples of the filler include inorganic fillers such as silica, alumina, clay, talc, aluminum hydroxide and calcium carbonate, and organic fillers such as cured epoxy resin, crosslinked benzoguanamine resin and crosslinked acrylic polymer. Among them, silica is preferably used as the filler.

The insulating resin composition may also include one or more additives of various kinds as necessary, such as a colorant, a flame retardant, a tackifier, a silane coupling agent, an antioxidant, an ultraviolet absorbent, and the like.

When these materials are added to the insulating resin composition, the total amount of the same is preferably 1 to 200% by mass, more preferably 10 to 80% by mass, with respect to the amount of the resin. If the above amount is less than 1% by mass, effects of reinforcing the aforementioned properties may not be achieved, while if the above amount is more than 200% by mass, properties that are inherent to the resin, such as strength, may deteriorate.

The substrate for use in the aforementioned applications is preferably formed from an insulating resin having a dielectric constant (relative dielectric constant) at 1 GHz of 3.5 or less, or has a layer formed from the insulating resin on a base material. Further, the substrate is preferably formed from an insulating resin having a dielectric loss tangent at 1 GHz of 0.01 or less, or has the layer formed from the insulating resin on a base material.

The dielectric constant and the dielectric loss tangent of an insulating resin may be measured by standard methods. For example, the properties may be measured by using a cavity resonator perturbation method (for example, a $\in r \tan \delta$ measuring device for a ultra-thin sheet, manufactured by KEYCOM CORP.)

As mentioned above, it is also advantageous to select the insulating resin material from the viewpoint of dielectric constant or dielectric loss tangent. Examples of the insulating resin having a dielectric constant of 3.5 or less and a dielectric loss tangent of 0.01 or less include liquid crystal polymers, polyimide resins, fluororesins, polyphenylene ether resins, cyanate ester resins, and bis(bisphenylene)ethane resins, and modified resins of these resins.

The substrate for use in the invention preferably has a surface roughness of 500 nm or less, more preferably 100 nm or less, even more preferably 50 nm or less, and most preferably 20 nm or less, in view of applications to semiconductor packages, various electrical wiring boards, and the like. The surface roughness of the substrate (when an intermediate layer or a polymerization initiation layer is provided, the surface roughness of that layer) is preferably smaller, since the electric loss at the time of transmitting electricity at high frequency can be reduced when the metal pattern material is used for wiring or the like.

When the substrate is a plate-shaped object such as a resin film (plastic film), the polymer layer may be formed on both sides of the substrate by conducting steps (a) and (b) to both sides thereof. When the polymer is formed on both sides of the substrate, a material having a metal film on both sides can be obtained by further conducing steps (c) and (d).

<Cyano Group-Containing Polymer>

In the invention, the cyano group-containing polymer that is used for the formation of the primer layer is not particularly limited as long as the polymer includes a unit having a cyano group in a side chain as a polymerizable component, but is preferably a polymer including a unit represented by the following formula (a) as a polymerizable component.

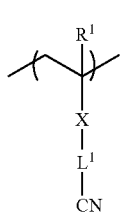

(1)

In formula (1), $R^1$ represents a hydrogen atom or an alkyl group that may be substituted or unsubstituted; X represents a single bond, a divalent organic group that may be substituted or unsubstituted, an ester group, an amide group or an ether group; and $L^1$ represents a divalent organic group that may be substituted or unsubstituted.

When $R^1$ is an alkyl group that may be substituted, examples of the alkyl group that is not substituted include a methyl group, an ethyl group, a propyl group and a butyl group. Examples of the alkyl group that is substituted include a methyl group, an ethyl group, a propyl group and a butyl group that are substituted by a methoxy group, a hydroxyl group, a chlorine atom, a bromine atom, a fluorine atom or the like.

$R^1$ is preferably a hydrogen atom, a methyl group, or a methyl group substituted by a hydroxyl group or a bromine atom.

When X is a divalent organic group that may be substituted or unsubstituted, examples of the divalent organic group include an aliphatic hydrocarbon group that may be substituted or unsubstituted and an aromatic hydrocarbon group that may be substituted or unsubstituted.

Examples of the aliphatic hydrocarbon group that may be substituted or unsubstituted include a methylene group, an ethylene group, a propylene group, a butylene group, and these groups substituted by a methoxy group, a hydroxyl group, a chlorine atom, a bromine atom, a fluorine atom or the like.

Examples of the aromatic hydrocarbon group that may be substituted or unsubstituted include a phenyl group that is not substituted, and a phenyl group substituted by a methoxy group, a hydroxyl group, a chlorine atom, a bromine atom, a fluorine atom or the like.

Among these, X is more preferably —(CH$_2$)n- (n is an integer of 1 to 3), further preferably —(CH$_2$)—.

$L^1$ is preferably a linear, branched or cyclic alkylene group, an aromatic group, or a combination of these groups. The group including a combination of an alkylene group and an aromatic group may further include an ether group, an ester group, an amide group, a urethane group, or a urea group in between. Among these, $L^1$ preferably has carbon atoms of 1 to 15 in total, and is particularly preferably not substituted. The number of carbon atoms of $L^1$ refers to the total number of carbon atoms included in the divalent organic group that may be substituted or unsubstituted represented by $L^1$.

Specific examples of $L^1$ include a methylene group, an ethylene group, a propylene group, a butylene group, a phenylene group, these groups substituted by a methoxy group, a hydroxyl group, a chlorine atom, a bromine atom, a fluorine atom or the like, or a combination of these groups.

The cyano group-containing polymer used in the invention preferably includes, as a polymerization component, a unit derived from a monomer having a cyano group as indicated below.

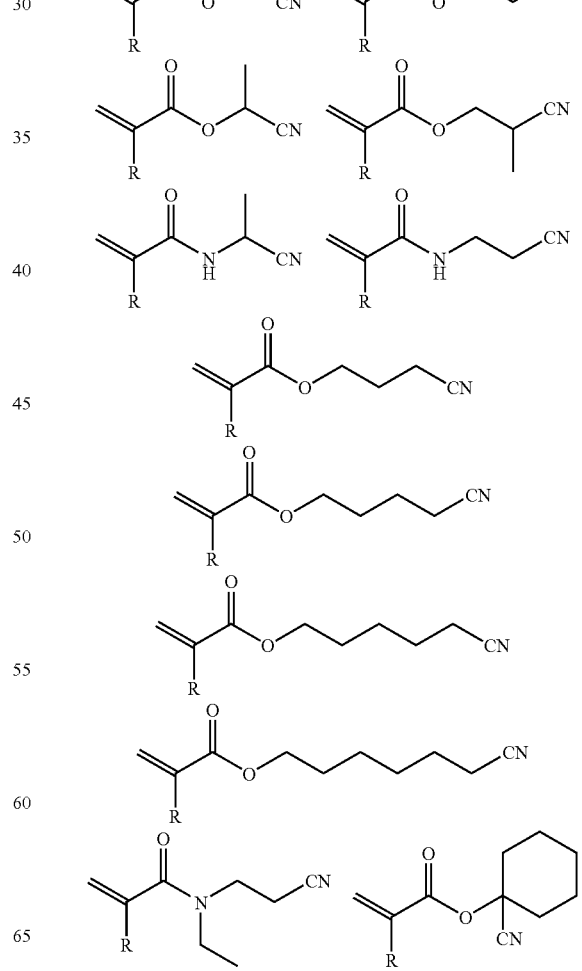

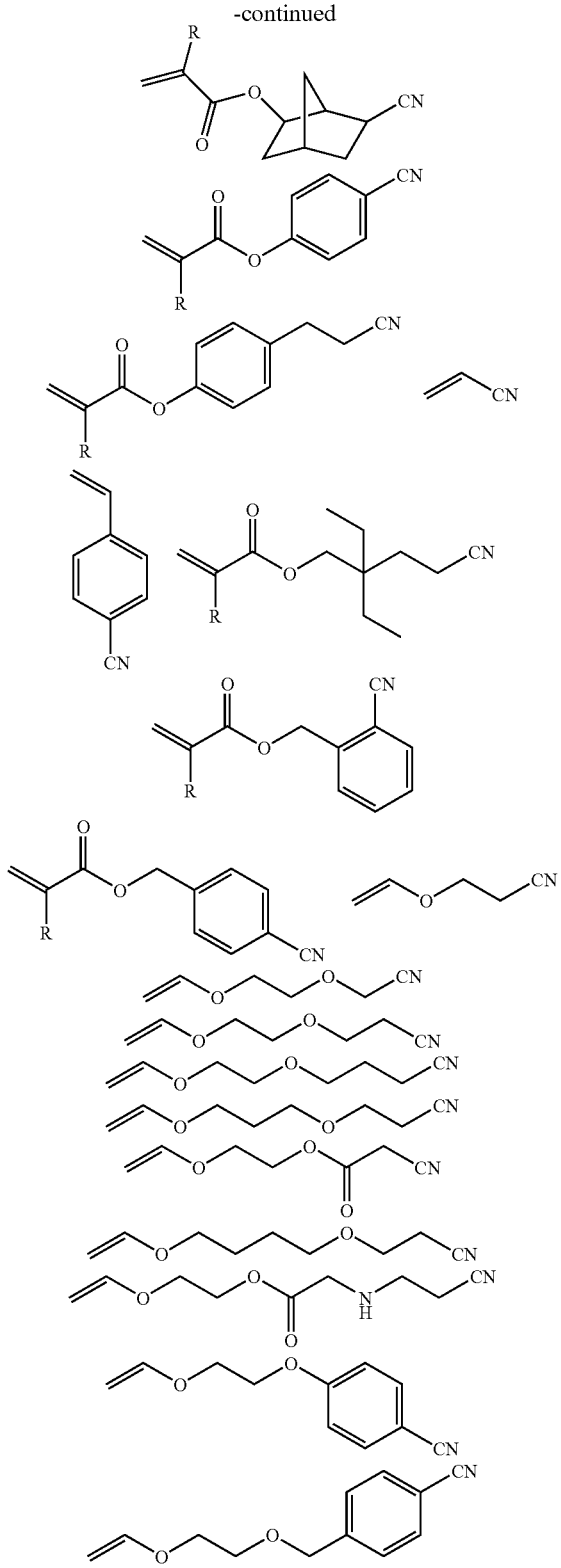

In the above formulae, R represents a hydrogen atom or a methyl group.

The cyano group-containing polymer used in the invention may include only one kind of unit derived from the above monomer, or may include two or more kinds of the units derived from the above monomer. The cyano group-containing polymer may also include a unit having no cyano group as a component to be copolymerized.

The amount of the cyano group contained in the cyano group-containing polymer used in the invention is preferably 1.0 to 9.0 mmol per gram of the polymer, from the viewpoint of adhesiveness of the primer polymer with respect to the substrate and the polymer layer.

The unit having no cyano group that may be included in the cyano group-containing polymer is not particularly limited as long as the unit does not contain a polar group. Preferable examples thereof include a unit having a linear or cyclic olefin structure, a conjugate diene unit, a polymerizable monovinyl aromatic unit having no polar group, a unit derived from a (meth)acrylate monomer having no polar group, and a unit derived from a (meth)acrylamide monomer having no polar group. Specific examples thereof include a unit derived from the monomers as shown below.

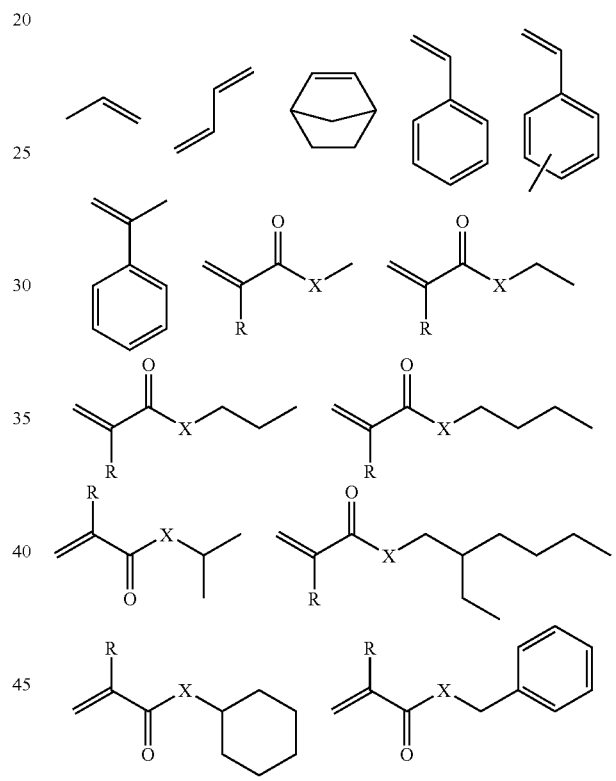

In the above formulae, R represents a hydrogen atom or a methyl group, and X represents O or NH.

The content of the unit having a cyano group in a side chain as a polymerization component in the cyano group-containing polymer is preferably 10 to 100 mol %, more preferably 30 to 100 mol % at a molar ratio.

The weight average molecular weight of the cyano group-containing polymer used in the invention is preferably 1,000 to 700,000, more preferably 2,000 to 200,000. In particular, the weight average molecular weight of the cyano group-containing polymer used in the invention is preferably 10,000 from the viewpoint of the primer layer with respect to the substrate.

Regarding the polymerization degree of the cyano group-containing polymer used in the invention, the polymer is preferably a decamer or more, more preferably a 20-mer or more. Further, the polymer is preferably a 7000-mer or less, more preferably a 3000-mer or less, even more preferably a 2000-mer or less, and particularly preferably a 1000-mer or less.
The following are specific examples of the cyano group-containing polymer used in the invention, but the invention is not limited thereto.
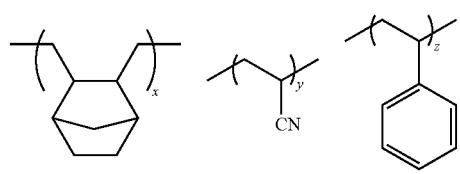
x = 5-40 mol %
y = 20-40 mol %
z = 40-70 mol %
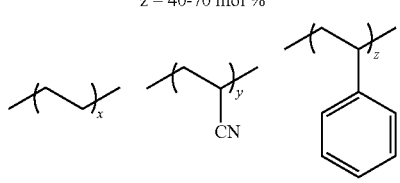
x = 5-40 mol %
y = 20-40 mol %
z = 40-70 mol %
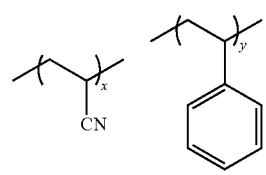
x = 20-40 mol %
y = 60-80 mol %
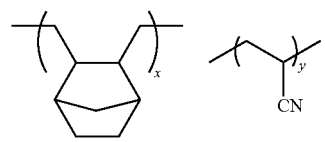
x = 60-80 mol %
y = 20-40 mol %
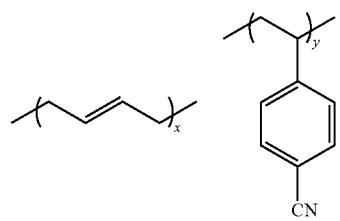
x = 5-40 mol %
y = 60-95 mol %
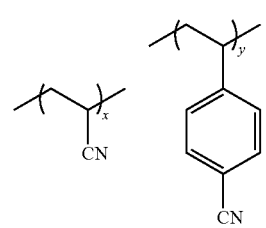
x = 20-40 mol %
y = 60-80 mol %
-continued
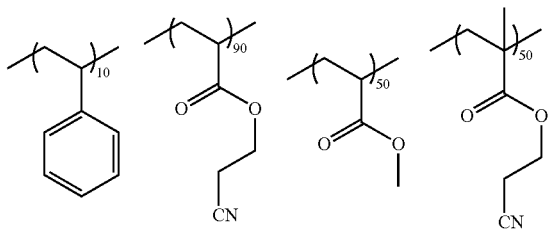
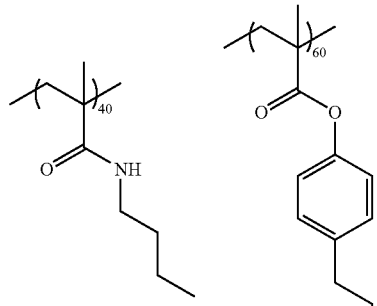
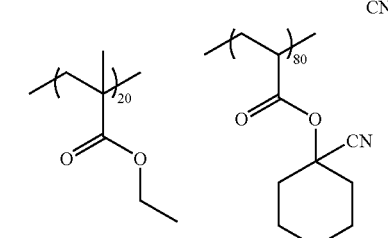
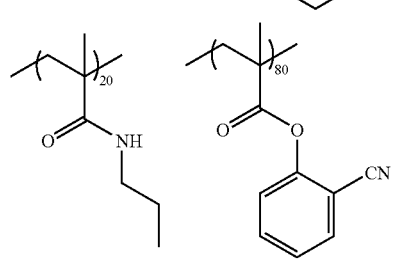
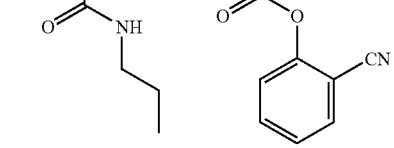
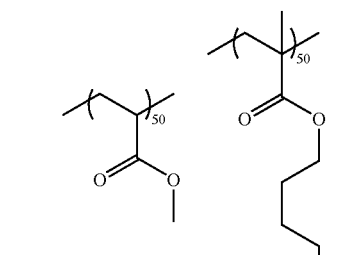
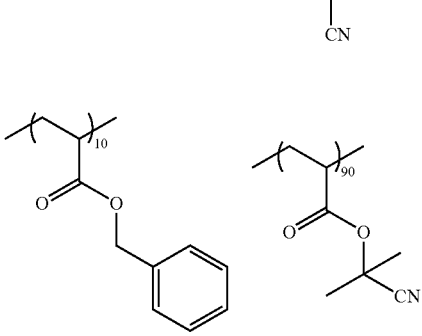

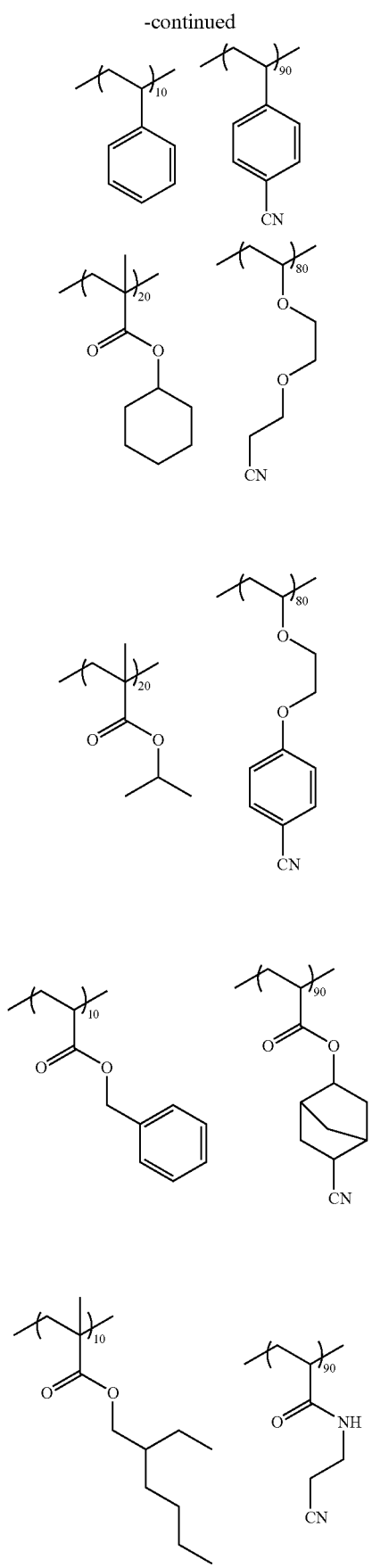
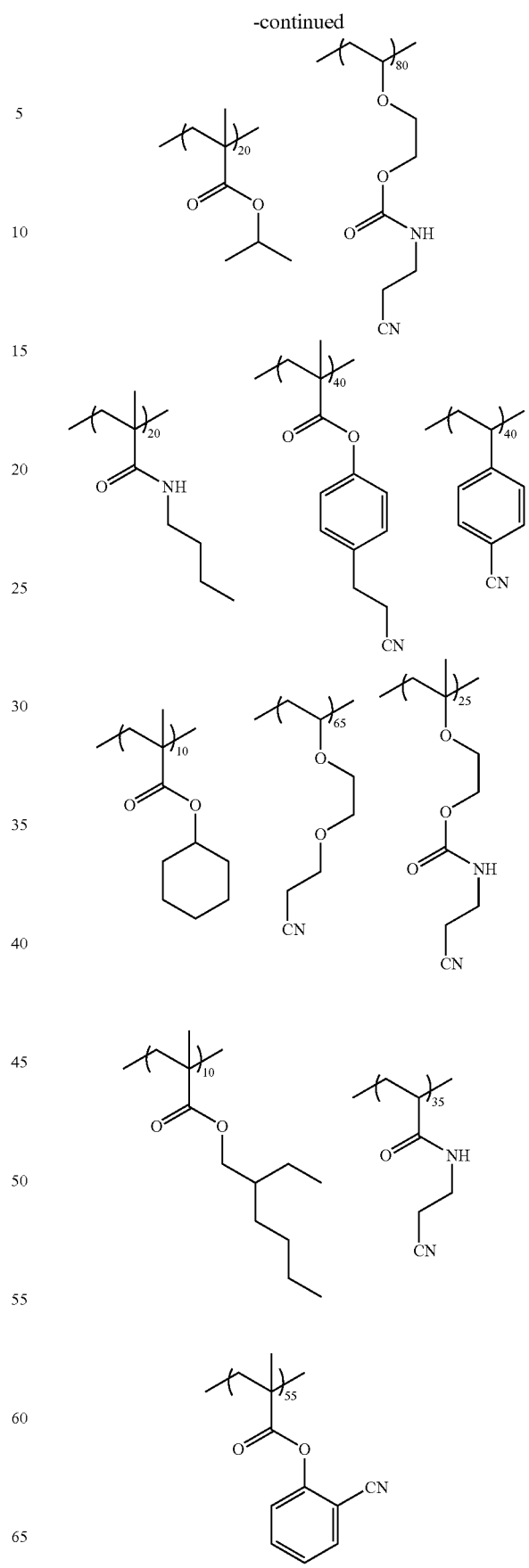

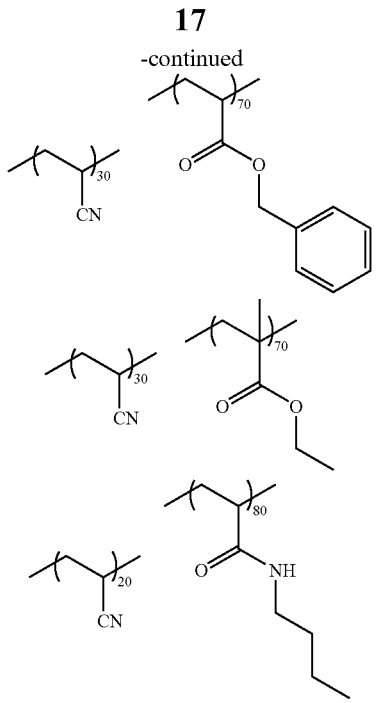

The formation of the primer layer may be performed by preparing an application composition by dissolving a cyano group-containing polymer as mentioned above in an appropriate solvent, applying the same to the surface of the substrate, and then drying the same.

Examples of the solvent that may be used include alcohol-based solvents such as methanol, ethanol, propanol, ethylene glycol, glycerin and propylene glycol monomethyl ether; acids such as acetic acid; ketone-based solvents such as acetone, methyl ethyl ketone and cyclohexanone; amide-based solvents such as formamide, dimethylacetamide and N-methylpyrrolidone; nitrile-based solvents such as acetonitrile and propionitrile; ester-based solvents such as methyl acetate and ethyl acetate; carbonate-based solvents such as dimethyl carbonate and diethyl carbonate; ether-based solvents such as tetrahydrofuran (THF) and 1,4-dioxane; and acetal-based solvents such as 1,3-dioxolan.

Among these, when the composition includes a cyano group-containing polymer, the solvent is preferably selected from amide-based solvents, ketone-based solvents, nitrile-based solvents and carbonate-based solvents, ether-based solvents and acetal-based solvents. Specifically, acetone, dimethyl acetomide, methyl ethyl ketone, cyclohexanone, acetonitrile, propionitrile, N-methylpyrrolidone, dimethyl carbonate, THF and 1,3-dioxolan are preferred.

When the composition containing a cyano group-containing polymer is applied by coating, a solvent having a boiling point of 50 to 150° C. is preferred from the viewpoint of handleability. The solvent may be used alone or in combination of two or more.

The composition for the primer layer may contain a surfactant. The surfactant is not particularly limited as long as it can dissolve in the solvent, and examples thereof include anionic surfactants such as sodium n-dodecylbenzenesulfonate; cationic surfactants such as n-dodecyltrimethylammonium chloride; and nonionic surfactants such as polyoxyethylene nonylphenol ether (examples of commercially available products include EMULGEN 910, trade name, manufactured by KAO CORP.), polyoxyethylene sorbitan monolaurate (examples of commercially available products include TWEEN 20, trade name, manufactured by TOKYO CHEMICAL INDUSTRY CO., LTD.), and polyoxyethylene lauryl ether.

As necessary, a plasticizer may also be added to the composition. The plasticizer may be selected from typical plasticizers. It is also possible to use a solvent having a high boiling point such as esters of phthalic acid (dimethyl ester, diethyl ester, dibutyl ester, di-2-ethylhexyl ester, di-normal-octyl ester, diisononyl ester, dinonyl ester, diisodecyl ester, butylbenzyl ester and the like), esters of adipic acid (dioctyl ester, diisononyl ester and the like), dioctyl azelate, esters of sebacic acid (dibutyl ester, dioctyl ester and the like), tricresyl phosphate, tributyl acetylcitrate, epoxidized soybean oil, trioctyl trimellitate, chlorinated paraffins, dimethylacetamide and N-methylpyrrolidone.

The composition that has been applied onto the substrate is preferably dried at 50 to 100° C. for 1 minute to 5 hours to form a primer layer.

The application amount of the composition in terms of solid content is preferably 0.1 to 10 g/m$^2$, more preferably 0.5 to 5 g/m$^2$, from the viewpoint of adhesion with respect to the substrate or uniformity of the obtained primer layer.

The primer layer may also be formed by other known methods such as a transfer method or a printing method.

As necessary, the primer layer may be formed in a patterned manner. The methods include a printing method (such as gravure printing, screen printing, flexographic printing, inkjet printing or imprinting), a developing method (such as wet etching, dry etching, ablation, curing/plasticizing (negative/positive) with light) and the like.

Step (b): Formation of Polymer Layer

In step (b), a polymer layer is formed on the primer layer formed in step (a) from a polymer having a functional group that interacts with an electroless plating catalyst or a precursor thereof (hereinafter, referred to as an "interactive group" sometimes) and a polymerizable group.

The polymer layer is preferably formed on the entire surface of the primer layer by applying a composition containing a polymer having an interactive group and a polymerizable group, and then drying the same.

In this process, part of the polymerizable groups bond to each other by polymerization reaction to form a firm polymer layer. Therefore, the obtained polymer layer is less prone to be damaged even when immersed in an electroless plating solution in the subsequent electroless plating process.

In the following, the polymer having an interactive group and a polymerizable group that may be suitably used for the formation of the polymer layer is described with reference to the preferable embodiments of the same.

(Polymer Having Interactive Group and Polymerizable Group)

The polymer having an interactive group and a polymerizable group (hereinafter, referred to a "specific polymer" sometimes) used in the invention is not particularly limited as long as an interactive group and a polymerizable group are bonded to the polymer main chain directly or via an appropriate linking group, but is preferably a copolymer including a unit having an interactive group and a unit having a polymerizable group.

A first preferable embodiment of the specific polymer is a copolymer including a unit having a polymerizable group represented by the following formula (a) and a unit having an interactive group represented by the following formula (b).

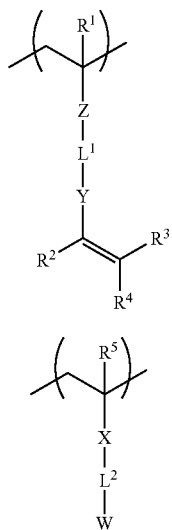

(a)

(b)

In formula (a) and formula (b), $R^1$ to $R^5$ each independently represent a hydrogen atom, or an alkyl group that may be substituted or unsubstituted; X, Y and Z each independently represent a single bond, a divalent organic group that may be substituted or unsubstituted, an ester group, an amide group, or an ether group; and $L^1$ and $L^2$ each independently represent a divalent organic group that may be substituted or unsubstituted. W represents a functional group that interacts with an electroless plating catalyst or a precursor thereof.

When $R^1$ to $R^5$ are an alkyl group that may be substituted or unsubstituted, the alkyl groups that are not substituted include a methyl group, an ethyl group, a propyl group or a butyl group, and the alkyl groups that are substituted include a methyl group, an ethyl group, a propyl group or a butyl group substituted by a methoxy group, a hydroxyl group, a chlorine atom, a bromine atom, a fluorine atom or the like.

$R^1$ is preferably a hydrogen atom, a methyl group, or a methyl group substituted by a hydroxyl group or a bromine atom.

$R^2$ is preferably a hydrogen atom, a methyl group, or a methyl group substituted by a hydroxyl group or a bromine atom.

$R^3$ is preferably a hydrogen atom.

$R^4$ is preferably a hydrogen atom.

$R^5$ is preferably a hydrogen atom, a methyl group, or a methyl group substituted by a hydroxyl group or a bromine atom.

When X, Y and Z are a divalent organic group that may be substituted or unsubstituted, examples of the divalent organic group include an aliphatic hydrocarbon group that may be substituted or unsubstituted, or an aromatic hydrocarbon group that may be substituted or unsubstituted.

The aliphatic hydrocarbon group that may be substituted or unsubstituted is preferably a methylene group, an ethylene group, a propylene group, a butylene group, or these groups substituted by a methoxy group, a hydroxyl group, a chlorine atom, a bromine atom, a fluorine atom or the like.

The aromatic hydrocarbon groups that may be substituted or unsubstituted is preferably a phenyl group that is not substituted or a phenyl group substituted by a methoxy group, a hydroxyl group, a chlorine atom, a bromine atom, a fluorine atom, or the like.

Among them, the divalent organic group is preferably —$(CH_2)_n$- (n is an integer of 1 to 3), more preferably —$CH_2$—.

$L^1$ is preferably a divalent organic group having a urethane bond or a urea bond, more preferably a divalent organic group having a urethane bond. The divalent organic group having a urethane bond or a urea bond particularly preferably includes a total number of carbon atoms of 1 to 9. Here, the total number of carbon atoms of $L^1$ refers to the total number of carbon atoms contained in the divalent organic group that may be substituted or unsubstituted represented by $L^1$.

More specifically, the structure of $L^1$ is preferably a structure represented by the following formula (1-1) or formula (1-2).

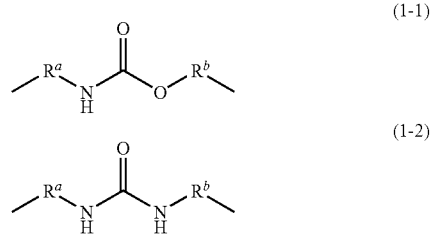

In formula (1-1) and formula (1-2), $R^a$ and $R^b$ each independently represent a divalent organic group formed from two or more atoms selected from the group consisting of a carbon atom, a hydrogen atom and an oxygen atom. Preferred examples thereof include a methylene group, an ethylene group, a propylene group, a butylene group, an ethylene oxide group, a diethylene oxide group, a triethylene oxide group, a tetraethylene oxide group, a dipropylene oxide group, a tripropylene oxide group, and a tetrapropylene oxide group. These groups may be substituted or unsubstituted.

$L^2$ is preferably a linear, branched or cyclic alkylene group, an aromatic group, or a group formed from a combination of these groups. The group formed from a combination of an alkylene group and an aromatic group may further include an ether group, an ester group, an amide group, a urethane group, or a urea group in between. Among these, $L^2$ is preferably a group having a total number of carbon atoms of 1 to 15, particularly preferably having no substituent. Here, the total number of carbon atoms of $L^2$ refers to the total number of carbon atoms contained in the divalent organic group that may be substituted or unsubstituted represented by $L^2$.

Specific examples of the divalent organic group that may be substituted or unsubstituted represented by $L^2$ include a methylene group, an ethylene group, a propylene group, a butylene group, a phenylene group, these groups substituted by a methoxy group, a hydroxyl group, a chlorine atom, a bromine atom, a fluorine atom or the like, and a group formed from a combination of these groups.

In formula (b), W is a functional that interacts with an electroless plating catalyst or a precursor thereof. Examples thereof include a functional group capable of electrostatically interacting with a metal ion, or a functional group including nitrogen, sulfur or oxygen capable of coordinating with a metal ion.

Examples of the interactive group represented by W include nitrogen-containing functional groups such as an amino group, an amide group, an imide group, a urea group, a tertiary amino group, an ammonium group, an amidino group, a triazine group, a triazole group, a benzotriazol group, a benzoimidazole group, a quinoline group, a pyridine group, a pyrimidine group, a pyrazine group, a quinazoline group, a quinoxaline group, a purine group, a triazine group, a piperidine group, a piperazine group, a pyrrolidine group, a pyrazole group, an aniline group, a group having an alkylamine group structure, a group having an isocyanuric structure, a nitro group, a nitroso group, an azo group, a diazo group, an azide group, a cyano group and a cyanate (R—O—CN) group; oxygen-containing functional groups such as an ether group, a hydroxyl group, a phenol hydroxyl group, a carbonyl group, a carbonate group, a carbonyl group, an ester group, a group having an N-oxide structure, a group having an S-oxide structure and a group having an N-hydroxy structure; sulfur-containing functional groups such as a thiophene group, a thiol group, a thiourea group, a thiocyanuric acid group, a benzothiazole group, a mercaptotriazine group, a thioether group, a thioxy group, a sulfoxide group, a sulfonic group, a sulfite group, a group having a sulfoximine structure, a group having a sulfoxonium salt structure, and a group having a sulfonic acid ester structure; phosphorus-containing functional groups such as a phosphate group, a phosphoramide group and a phosphine group; groups containing a halogen atom such as chlorine or bromine; and groups containing an unsaturated ethylenic bond. When the group capable of having a salt structure, a salt thereof may also be used.

Among these, an ether group (more specifically, a group having a structure represented by —O—(CH$_2$)n-O— where n is an integer of from 1 to 5), a cyano group, a carboxyl group and a nitrile group are more preferable due to their high polarity and high adsorbability to a plating catalyst or a precursor thereof, and a carboxyl group and a nitrile group are most preferable.

Further, a functional group derived from a compound capable of forming a clathrate may also be used as the interactive group. For example, it is possible to introduce a functional group having a partial structure of cyclodextrin, crown ether, cyclic polyamine or the like.

The functional group that may be used as the interactive group may be included in the polymer alone or in combination of two or more.

The unit having a polymerizable group represented by formula (a) is preferably a unit represented by the following formula (c).

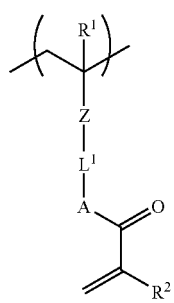

(c)

In formula (c), $R^1$ and $R^2$ each independently represent a hydrogen atom, or an alkyl group that may be substituted or unsubstituted; Z represents a single bond, a divalent organic group that may be substituted or unsubstituted, an ester group, an amide group, or an ether group; A represents an oxygen atom, or NR (wherein R represents a hydrogen atom or an alkyl group, preferably a hydrogen atom or an alkyl group having 1 to 5 carbon atoms that is not substituted); and $L^1$ represents a divalent organic group that may be substituted or unsubstituted.

$R^1$ and $R^2$ in formula (c) have the same definitions as $R^1$ and $R^2$ in formula (a), and preferred examples are also the same.

Z in formula (c) has the same definitions as Z in formula (a), and preferred examples are also the same.

$L^1$ in formula (c) has the same definitions as $L^1$ in formula (a), and preferred examples are also the same.

The unit represented by formula (c) is preferably a unit represented by the following formula (d).

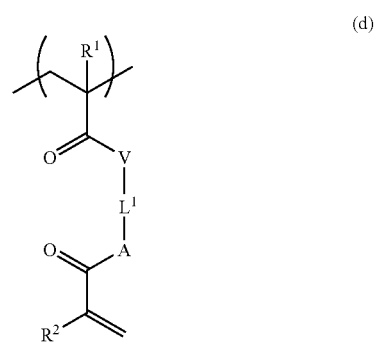

(d)

In formula (d), $R^1$ and $R^2$ each independently represent a hydrogen atom, or an alkyl group that may be substituted; V and A each independently represent an oxygen atom, or NR (wherein R represents a hydrogen atom or an alkyl group, preferably a hydrogen atom or an alkyl group having 1 to 5 carbon atoms that is not substituted); and $L^1$ represents a divalent organic group that may be substituted or unsubstituted.

$R^1$ and $R^2$ in formula (d) have the same definitions as $R^1$ and $R^2$ in formula (a), and preferred examples are also the same.

$L^1$ in formula (d) has the same definitions as $L^1$ in formula (a), and preferred examples are also the same.

In formula (c) and formula (d), A is preferably an oxygen atom.

In formula (c) and formula (e), $L^1$ is preferably an alkylene group that is not substituted, or a divalent organic group having a urethane bond or a urea bond, more preferably a divalent organic group having a urethane bond. Among these, those having a total number of carbon atoms of 1 to 9 are particularly preferred.

The unit represented by formula (b) is preferably a unit represented by the following formula (e).

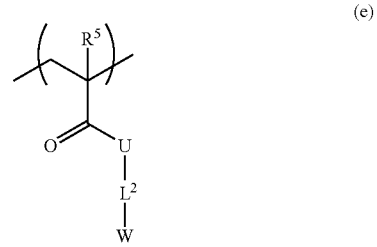

(e)

In formula (e), $R^5$ represents a hydrogen atom, or an alkyl group that may be substituted or unsubstituted; U represents an oxygen atom or NR' (wherein R' represents a hydrogen atom or an alkyl group, preferably a hydrogen atom or an alkyl group having 1 to 5 carbon atoms that is not substituted); and $L^2$ represents a divalent organic group that may be substituted or unsubstituted.

$R^5$ in formula (e) has the same definitions as $R^1$ and $R^2$ in formula (a), and is preferably a hydrogen atom.

$L^2$ in formula (e) has the same definitions as $L^2$ in formula (a), and is preferably a linear, branched or cyclic alkylene group, an aromatic group, or a group formed from a combination of these groups.

In particular, in formula (e), the linkage site to the interactive group in $L^2$ is preferably a divalent organic group including a linear, branched or cyclic alkylene group, more preferably one having the total number of carbon atoms of 1 to 10.

In another preferred exemplary embodiment, the linkage site to the interactive group in $L^2$ in formula (e) is preferably a divalent organic group having an aromatic group, more preferably one having the total number of carbon atoms of 6 to 15.

W in formula (e) has the same definitions as W in formula (b), and preferred examples are also the same.

The specific polymer preferably includes a unit selected from formula (a), (c) or (d) and a unit selected from formula (b) or (e), and has the interactive group and the polymerizable group in a side chain thereof.

The specific polymer may be synthesized, for example, by the following method.

There are several types of polymerization reaction used in the synthesis of the specific polymer, including radical polymerization, cationic polymerization and anionic polymerization. From the viewpoint of controlling the reaction, radical polymerization or cationic polymerization is preferable.

The synthesis method of the specific polymer is different depending on whether: 1) the mode of polymerization of the polymer main chain is different from that of the polymerizable group to be introduced into the side chain; or 2) the mode of polymerization of the polymer main chain is the same as that of the polymerizable group to be introduced into the side chain.

The ratio of the unit having a polymerizable group and the ratio of the unit having an interactive group with respect to the total amount of copolymerization components are preferably within the following ranges, respectively.

The ratio of the unit having a polymerizable group is preferably 5 to 50 mol %, more preferably 5 to 40 mol %, with respect to the total amount of copolymerization components. If the above ratio is less than 5 mol %, reactivity (curability or polymerizability) may not be sufficient. If the above ratio is more than 50 mol %, gelation tends to occur to hinder the synthesis.

The ratio of the unit having an interactive group is preferably 5 to 95 mol %, more preferably in 10 to 95 mol %, with respect to the total amount of copolymerization components, from the viewpoint of adsorbability to a plating catalyst or the like.

The weight average molecular weight of the specific polymer is preferably 1,000 to 700,000, more preferably 2,000 to 200,000. In particular, from the viewpoint of polymerization sensitivity, the weight average molecular weight of the specific polymer is preferably 20,000 or more.

Regarding the polymerization degree of the specific polymer, the polymer is preferably a decamer or more, more preferably a 20-mer or more. Further, the polymer is preferably a 7000-mer or less, more preferably a 3000-mer or less, even more preferably a 2000-mer or less, and particularly preferably a 1000-mer or less.

The following are specific examples of the specific polymer used in the invention, but the invention is not limited thereto.

The weight average molecular weight of these specific examples is in the range of 3,000 to 100,000.

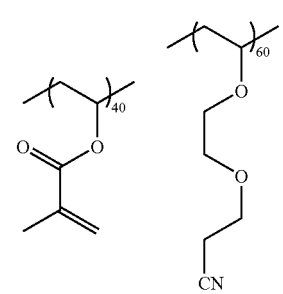

1-1-1

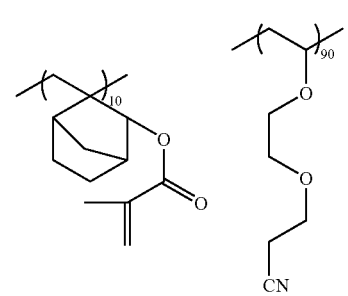

1-1-2

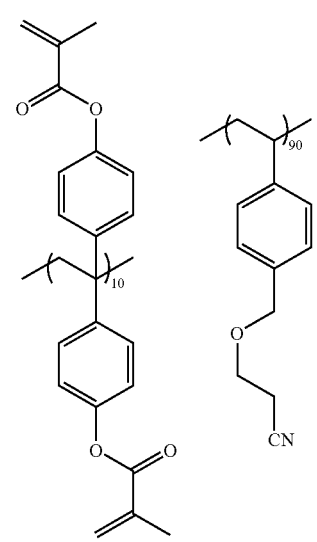

1-1-3

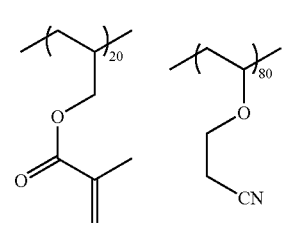

1-1-4

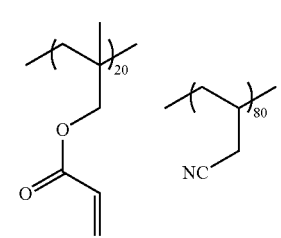

1-1-5

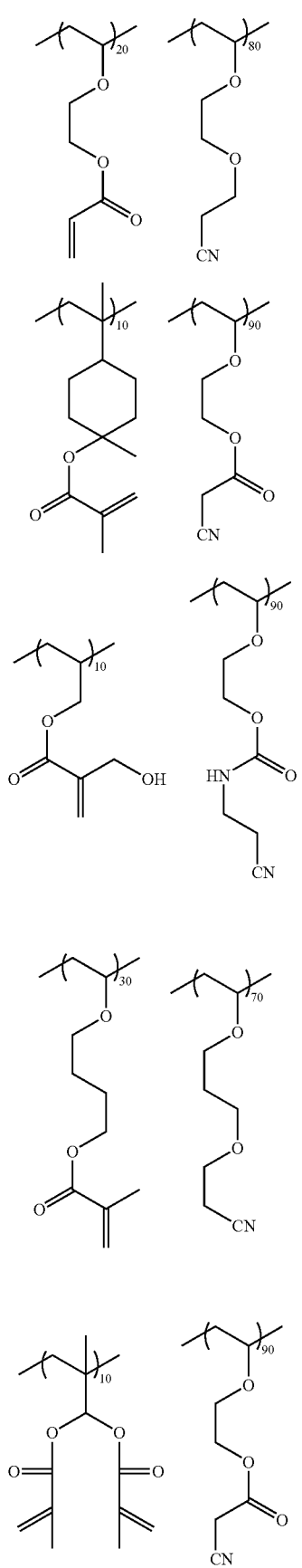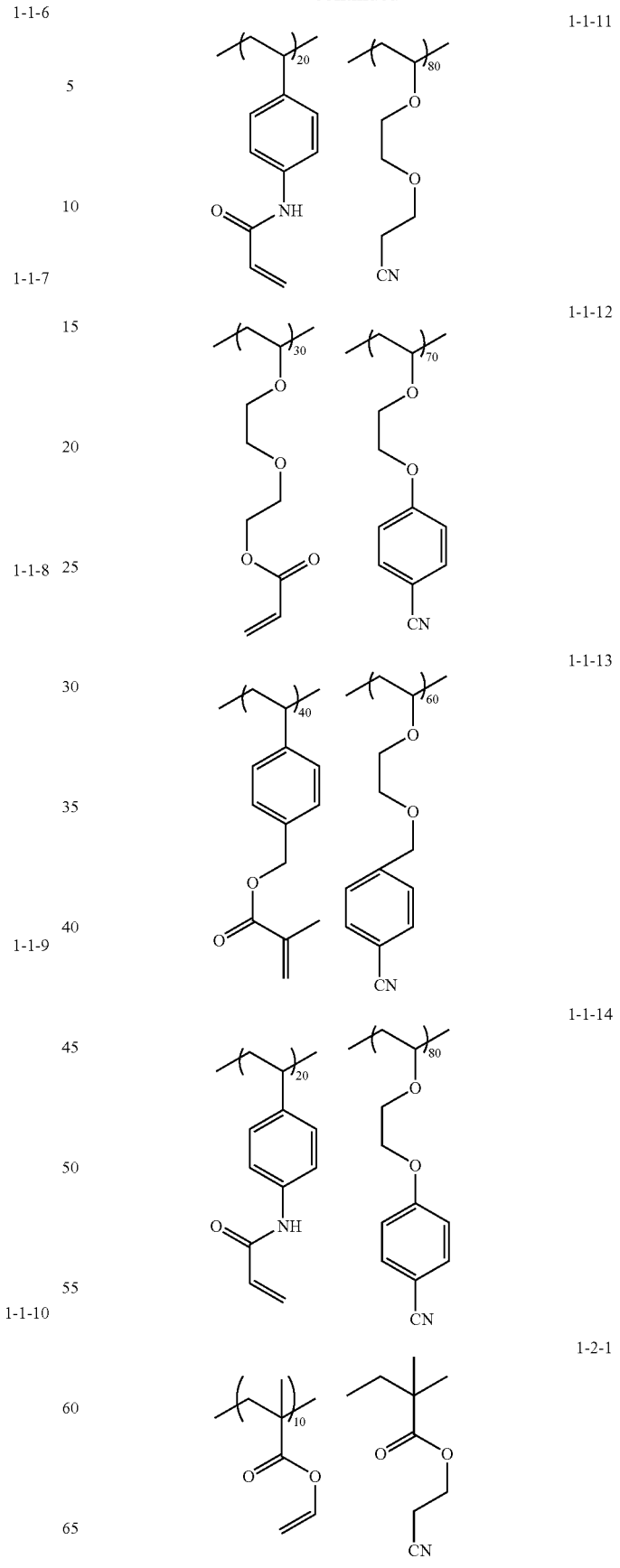

1-2-2
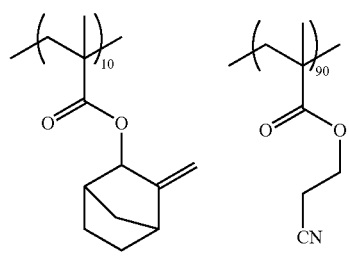
1-2-3
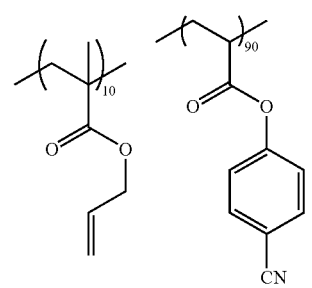
1-2-4
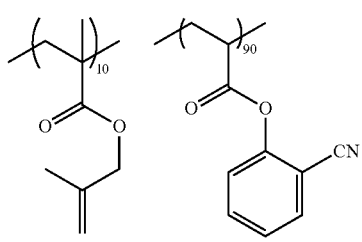
1-2-5
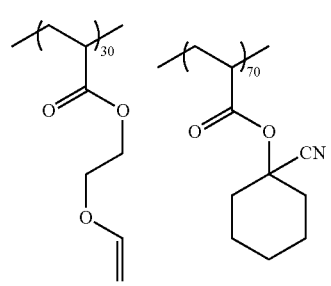
1-2-6
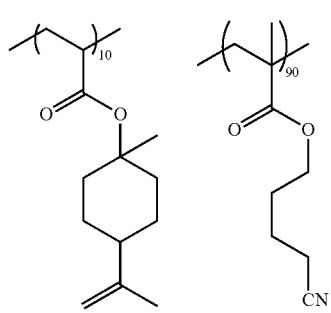
1-2-7
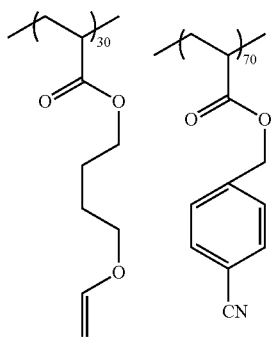
1-2-8
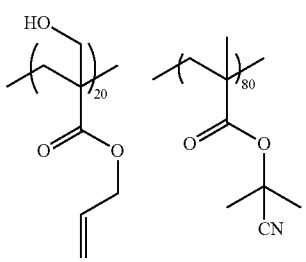
1-2-9
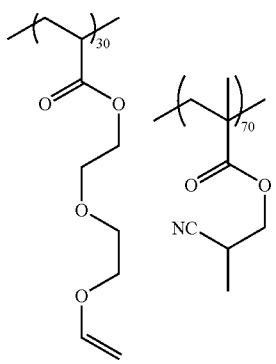
1-2-10
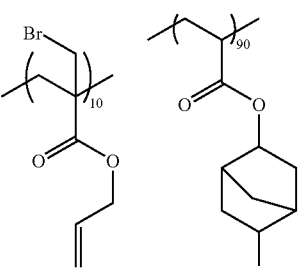
1-2-11
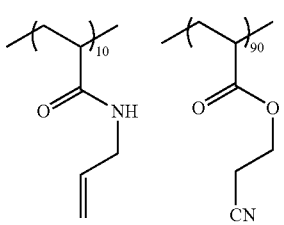

2-1-1 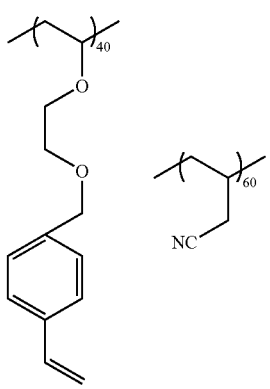
2-1-2 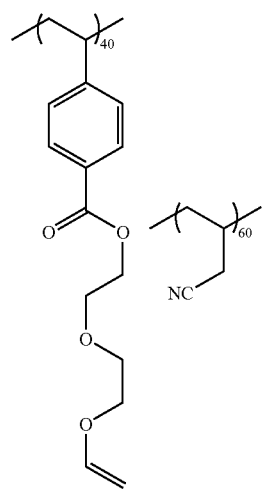
2-1-3 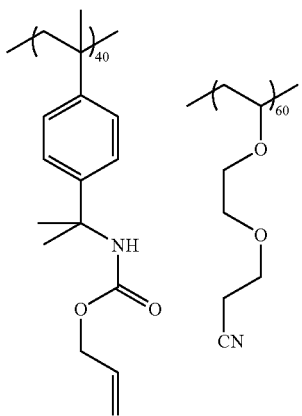
2-1-4 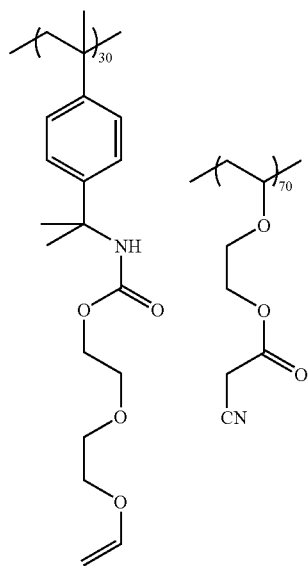
2-1-5 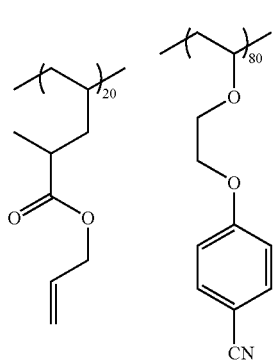
2-2-1 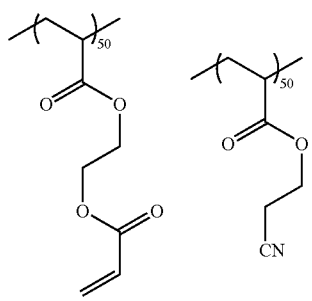
2-2-2 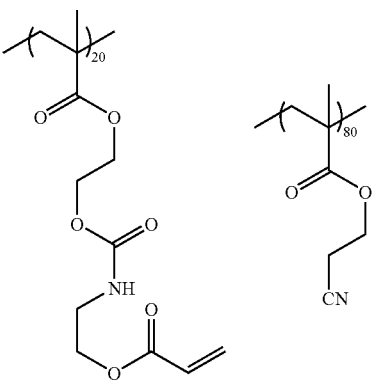

2-2-3 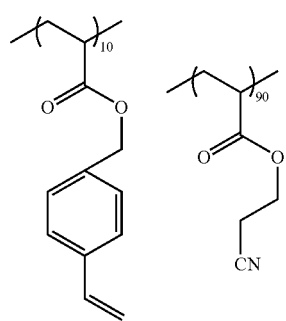
2-2-4 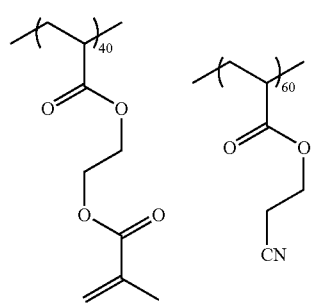
2-2-5 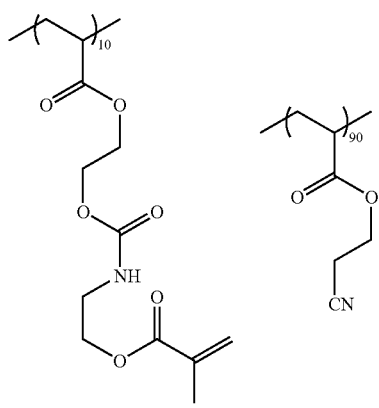
2-2-6 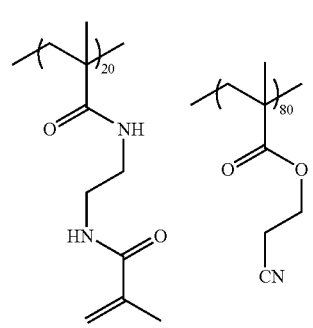
2-2-7 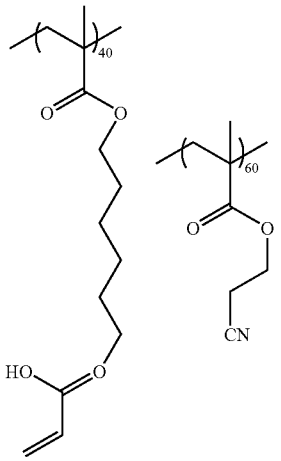
2-2-8 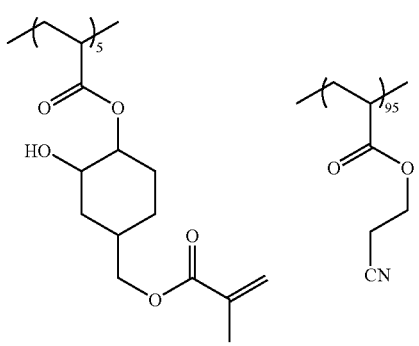
2-2-9 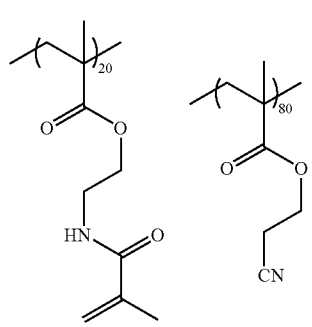
2-2-10 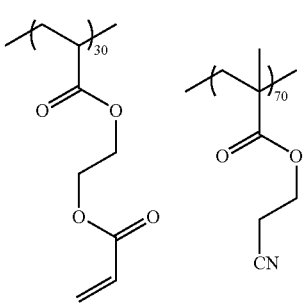

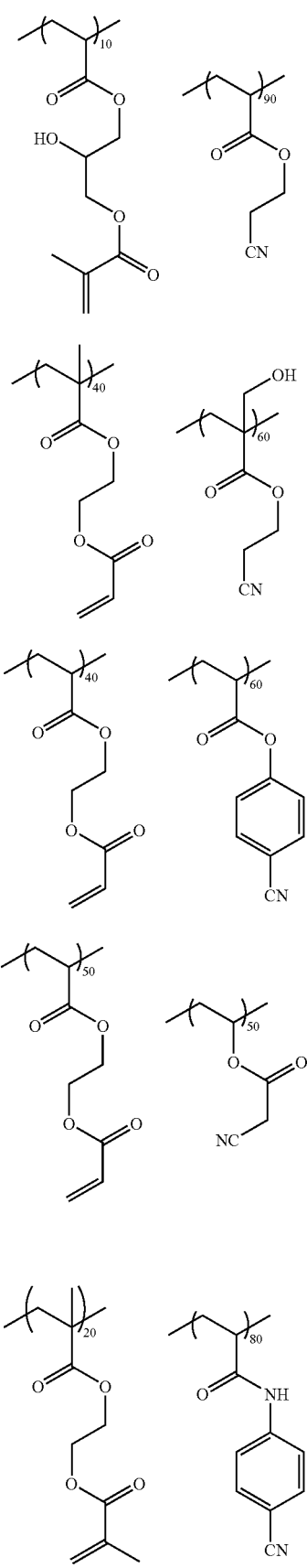
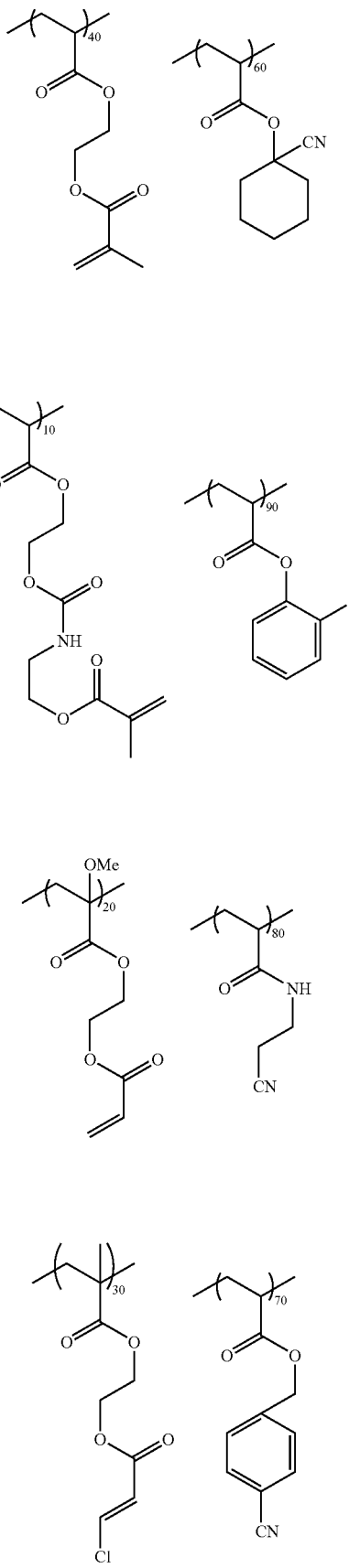

2-2-20
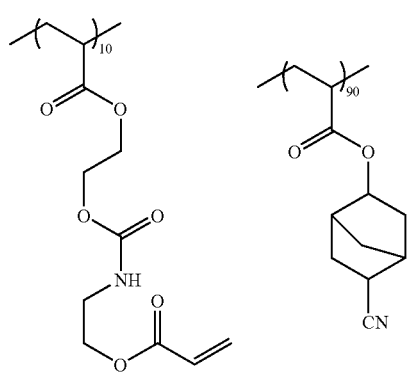
2-2-21
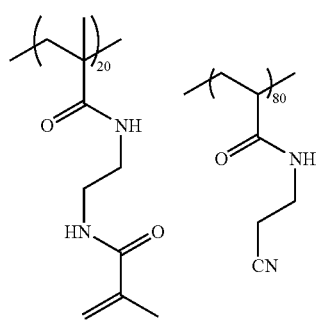
2-2-22
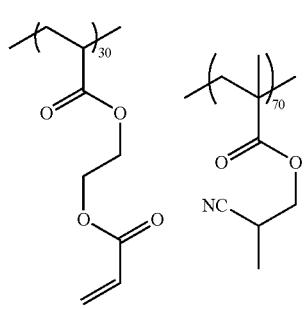
2-2-23
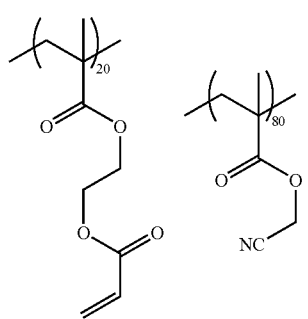
2-2-24
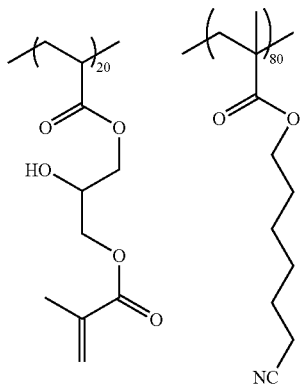
2-2-25
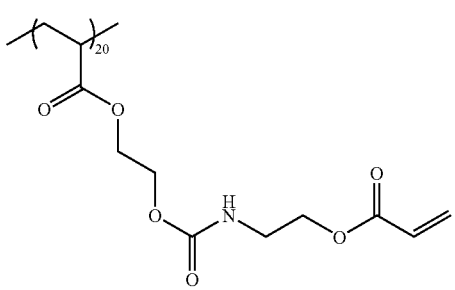
2-2-26
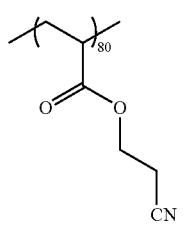
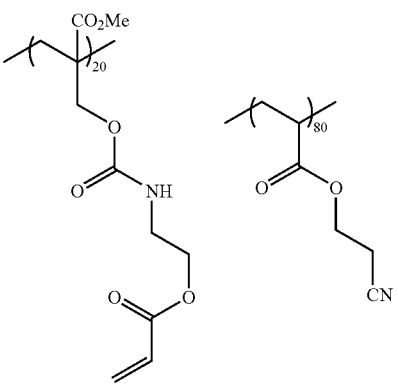

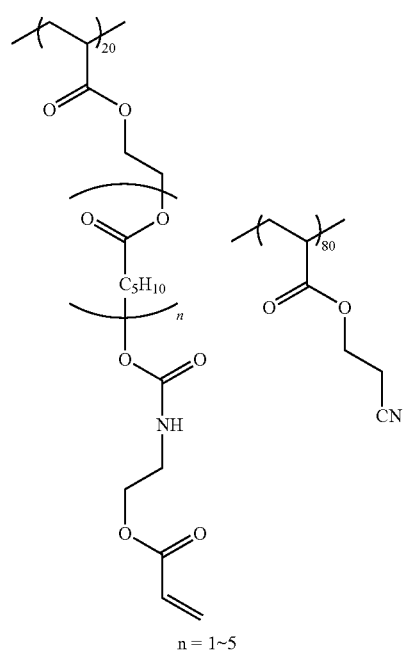
2-2-27
n = 1~5
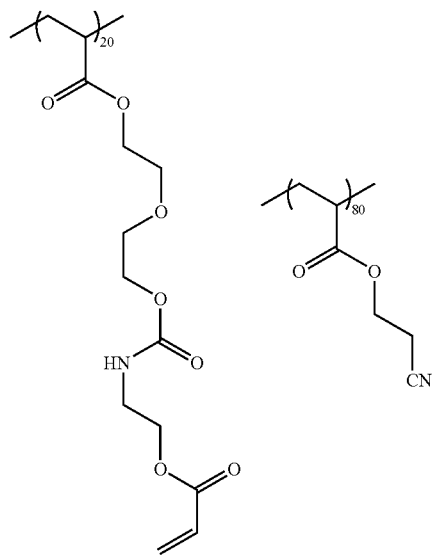
2-2-29
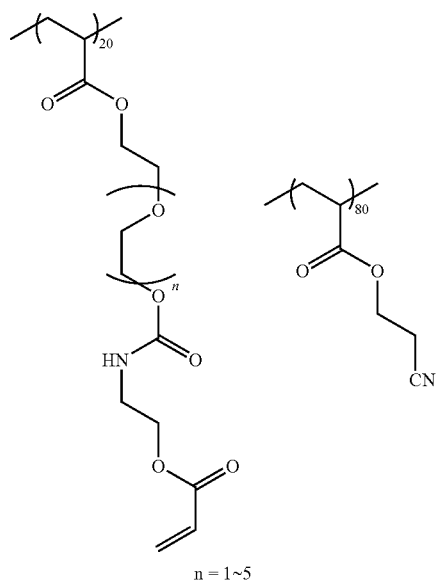
2-2-28
n = 1~5
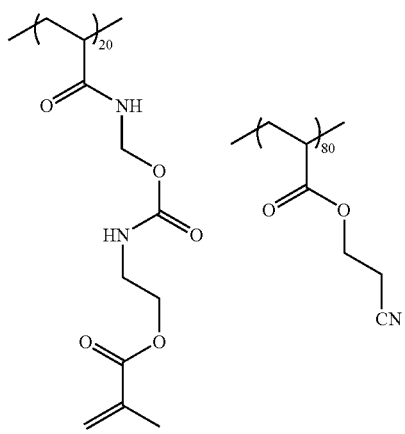
2-2-30
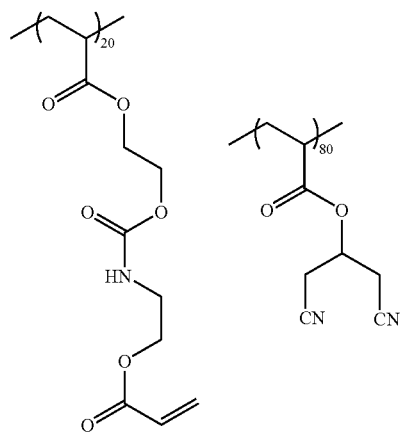
2-2-31

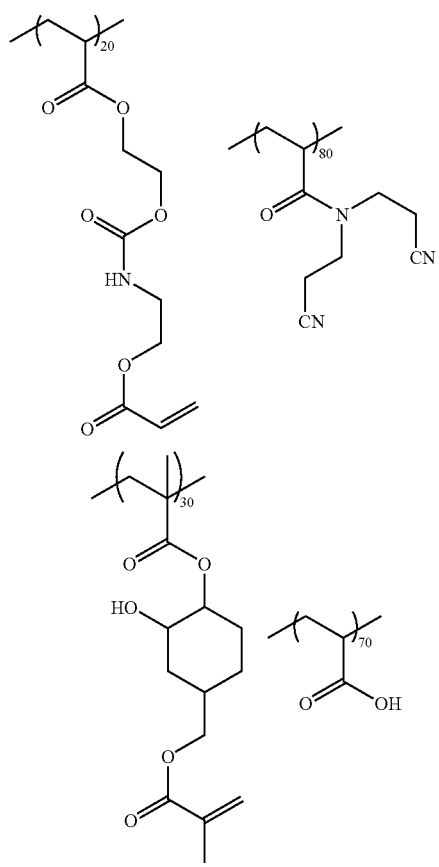
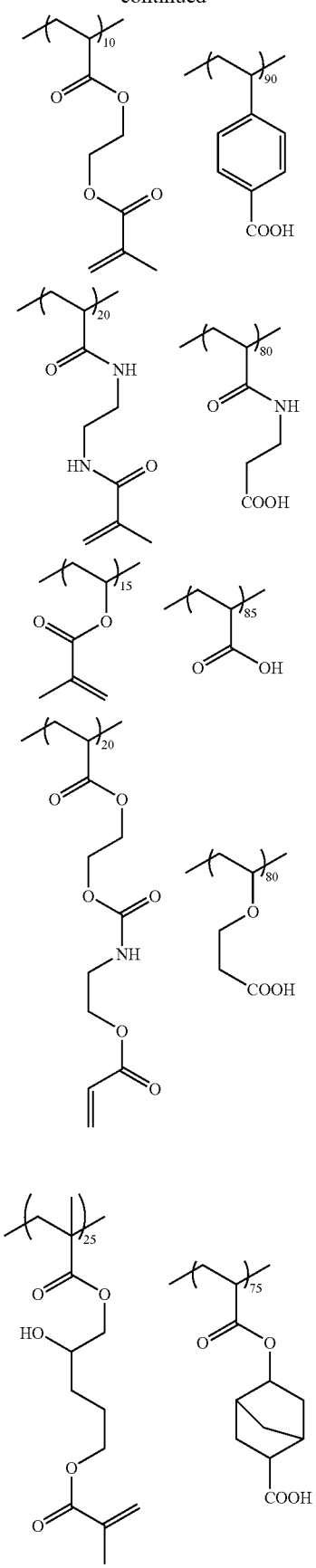

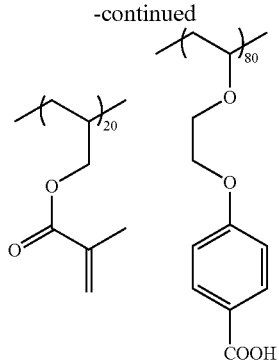
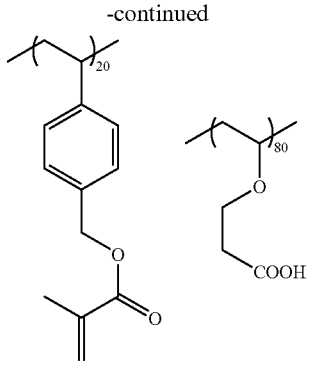
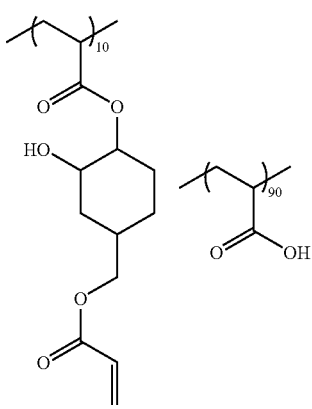
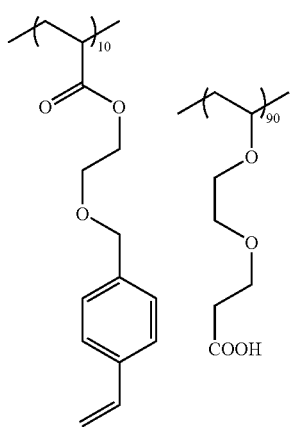
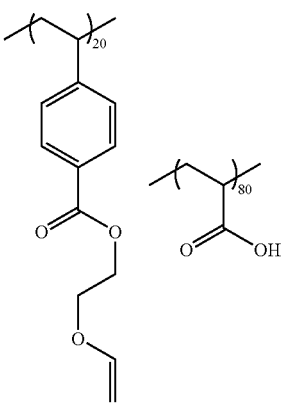
A second preferable embodiment of the specific polymer further includes an ionic polar group, in addition to the interactive group and polymerizable group.
Specific examples include a copolymer including a unit represented by the following formula (A), a unit represented by the following formula (B) and a unit represented by the following formula (C).
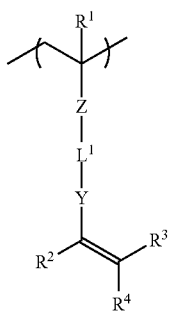
(A)
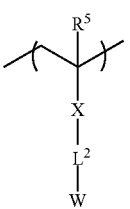
(B)
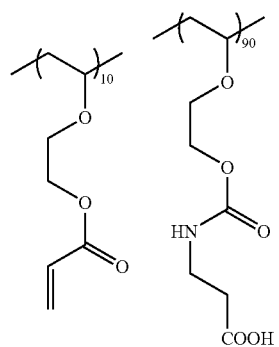

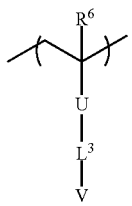

(C)

In Formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a divalent organic group that may be substituted or unsubstituted; W represents a non-dissociative functional group that interacts with an electroless plating catalyst or a precursor thereof; and V represents an ionic polar group.

Formula (A) has the same definitions as the unit having a polymerizable group in formula (a), and preferred examples are also the same. Formula (B) has the same definitions as the unit having an interactive group in formula (b), and preferred examples are also the same. The polymer of the second preferred embodiment includes a unit having an ionic polar group, in addition to these units.

In the following, preferable examples of formulae (A) to (C) are described.

In formulae (A) to (C), when $R^1$ to $R^6$ are an alkyl group that may be substituted or unsubstituted, examples of the alkyl group that is not substituted include a methyl group, an ethyl group, a propyl group, and a butyl group. Examples of the alkyl group that is substituted include a methyl group, an ethyl group, a propyl group and a butyl group that are substituted by a methoxy group, a hydroxyl group, a chlorine atom, a bromine atom, a fluorine atom or the like.

$R^1$ is preferably a hydrogen atom, a methyl group, or a methyl group substituted by a hydroxyl group or a bromine atom.

$R^2$ is preferably a hydrogen atom, a methyl group, or a methyl group substituted by a hydroxyl group or a bromine atom.

$R^3$ is preferably a hydrogen atom.

$R^4$ is preferably a hydrogen atom.

$R^5$ is preferably a hydrogen atom, a methyl group, or a methyl group substituted by a hydroxyl group or a bromine atom.

$R^6$ is preferably a hydrogen atom, a methyl group, or a methyl group substituted by a hydroxyl group or a bromine atom.

Further, from the viewpoint of flexibility, it is preferable that all of $R^1$, $R^5$ and $R^6$ be a hydrogen atom.

When X, Y, Z and U are a divalent organic group that may be substituted or unsubstituted, examples thereof include an aliphatic hydrocarbon group that may be substituted or unsubstituted and an aromatic hydrocarbon group that may be substituted or unsubstituted. X, Y, Z and U are preferably an ester group, an amide group or an ether group, more preferably an ester group or an amide group, and most preferably an ester group.

$L^1$, $L^2$ and $L^3$ are each independently a linear, branched or cyclic alkylene group, an aromatic group, or a combination of these groups. The group including a combination of the alkylene group and the aromatic group may further include an ether group, an ester group, an amide group, a urethane group or a urea group in between. Among these, $L^1$, $L^2$ and $L^3$ each preferably have total carbon atoms of 1 to 15, and are particularly preferably not substituted. The total carbon atoms here refer to, for example, the total number of carbon atoms included in the divalent organic group that may be substituted or unsubstituted represented by $L^1$. The same applies to $L^2$ and $L^3$.

Specific examples of $L^1$, $L^2$ and $L^3$ include a methylene group, an ethylene group, a propylene group, a butylene group, a phenylene group, these groups substituted by a methoxy group, a hydroxyl group, a chlorine atom, a bromine atom, a fluorine atom or the like, or a combination of these groups.

In particular, the unit represented by formula (C) preferably has a carboxyl group as V and a 4 to 8-membered ring structure at a position at which $L^3$ is linked to V. In this case, the unit exhibits an appropriate degree of acidity (such that other functional groups do not decompose) and hydrophilicity in an alkali aqueous solution, while tends to exhibit hydrophobicity when dried due to the ring structure. Examples of the 4 to 8-membered ring structure include a cyclobutyl group, a cyclopentyl group, a cyclohexyl group, a cycloheptyl group, a cyclooctyl group, and a phenyl group. Among these, a cyclohexyl group and a phenyl group are preferred.

Further, the unit represented by formula (C) preferably has a carboxyl group as V and an alkyl group structure having a chain length of 6 to 18 atoms as $L^3$. In this case, the unit exhibits an appropriate degree of acidity (such that other functional groups do not decompose) and hydrophilicity in an alkali aqueous solution, while tends to exhibit hydrophobicity when dried due to the long-chain alkyl group structure. The chain length of $L^3$ refers to a distance between U and V in formula (C). Therefore, 6 to 18 atoms are preferably positioned between U and V. The chain length of $L^3$ is more preferably 6 to 14 atoms, further preferably 6 to 12 atoms.

In the unit represented by formula (B), W is a non-dissociative functional group that interacts with a plating catalyst or a precursor thereof. The non-dissociative functional group has the same definitions as that in the aforementioned formula (b), and preferable examples are also the same. Specifically, W is preferably a cyano group or an ether group due to its high polarity or high absorbability to a plating catalyst or the like.

In the unit represented by formula (C), V represents an ionic polar group and examples thereof include those as mentioned above. Among these, a carboxyl group is preferably due to its appropriate degree of acidity (such that other functional groups do not decompose), particularly preferably an alicyclic carboxyl group.

In the second preferable embodiment of the specific polymer, the unit represented by formula (A) is preferably included at an amount of 5 to 50 mol %, more preferably 5 to 30 mol %, with respect to the total amount of the copolymerization units, from the viewpoint of reactivity (curability or polymerizability) and suppressing gelation upon synthesis.

The unit represented by formula (B) is preferably included at an amount of 5 to 80 mol %, more preferably 10 to 70 mol %, with respect to the total amount of the copolymerization units, from the viewpoint of adsorbability to a plating catalyst or the like.

The unit represented by formula (C) is preferably included at an amount of 20 to 70 mol %, more preferably 20 to 60 mol %, with respect to the total amount of copolymerization units, from the viewpoint of developability with an aqueous solution and moisture-proof adhesiveness. The above content is particularly preferably 30 to 50 mol % for a better achievement of both the developability with an aqueous solution and the moisture-proof adhesiveness.

The value of ionic polarity (an acid value when the ionic polar group is a carboxyl group) of the second embodiment of the specific polymer is preferably 1.5 to 7.0 mmol/g, more preferably 1.7 to 5.0 mmol/g, and particularly preferably 1.9 to 4.0 mmol/g. When the value of ionic polarity is within the above range, it is possible to impart the specific polymer with developability in an aqueous solution, while suppressing the reduction in adhesiveness with time under hot and humid conditions.

The optimal number of the unit and the value of ionic polarity may change depending on the molecular weight of the unit having an ionic polar group. In this case, optimization of the value of ionic polarity to be within the above range is given priority.

The following are specific examples of the specific polymer. However, the invention is not limited thereto. The weight average molecular weight of these specific examples is within a range of 3,000 to 150,000.

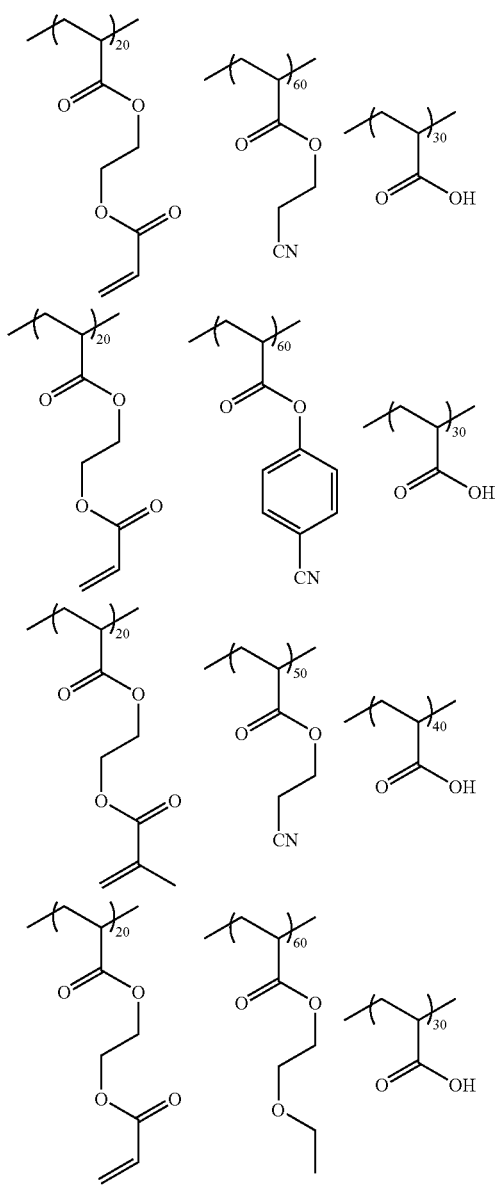

-continued

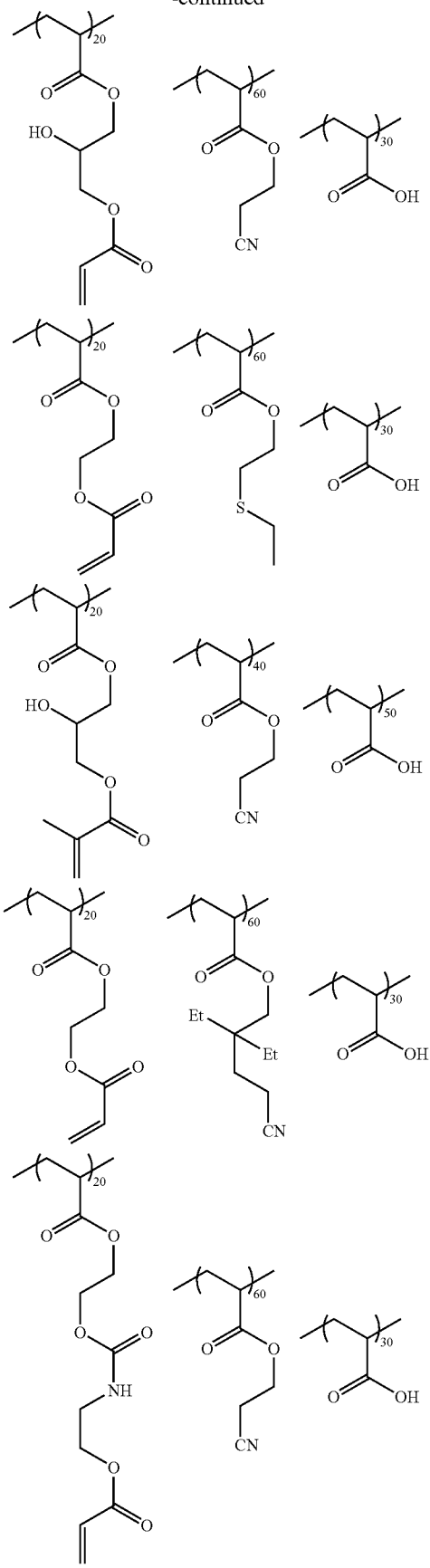

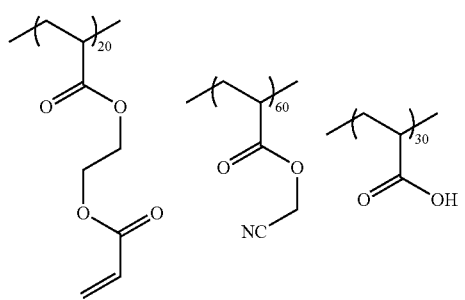

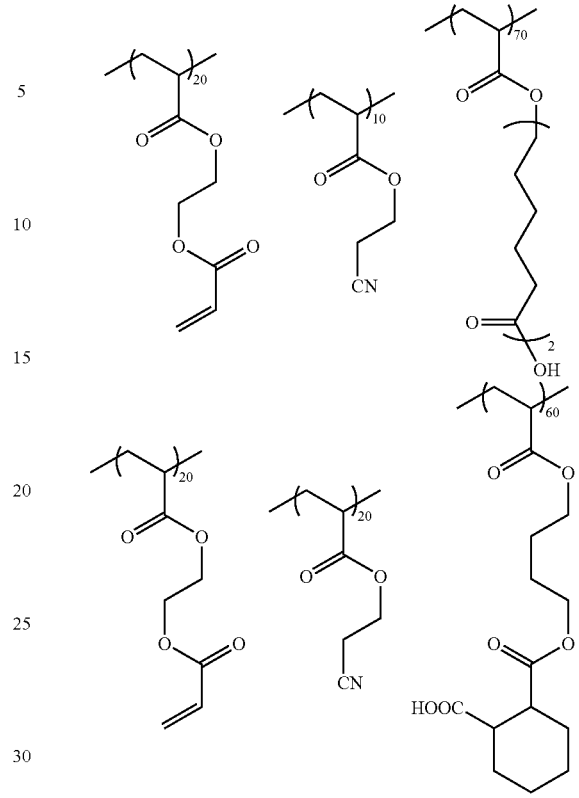

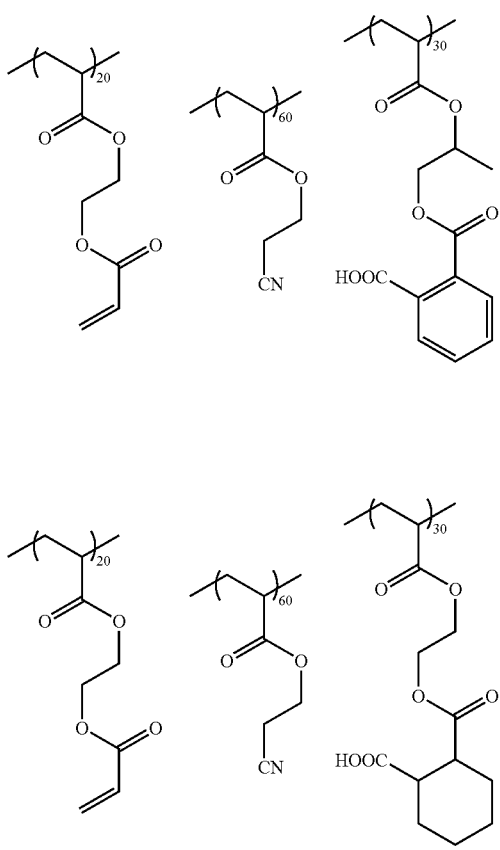

(Synthesis Method of Specific Polymer)

In the following, a synthesis method of the second preferable embodiment of the specific polymer according to the invention is described.

The specific polymer according to the invention is not particularly limited as long as it has a non-dissociative interactive group, a radical polymerizable group and an ionic polar group, but is preferably a polymer having each of the interactive group, radical polymerizable group and ionic polar group in a side chain thereof. The specific polymer according to the invention is preferably a copolymer including a unit having an interactive group, a unit having a radical polymerizable group and a unit having an ionic polar group, such as those including the units represented by the aforementioned formulae (A) to (C).

The following are explanations of an embodiment of the specific polymer that includes a unit having an interactive group, a unit having a radical polymerizable group and a unit having an ionic polar group, and a synthesis method of the same.

The specific polymer having an embodiment of a copolymer as mentioned above may be polymerized by the following synthesis methods i) to iii).

i) a method including copolymerizing a monomer having a non-dissociative interactive group, a monomer having a radical-polymerizable group and a monomer having an ionic polar group.

ii) a method including copolymerizing a monomer having a non-dissociative interactive group, a monomer having a double bond precursor and a monomer having an ionic polar group, and then introducing a double bond by treating with a base or the like.

iii) a method including synthesizing a polymer from a monomer having a non-dissociative interactive group and a monomer having an ionic polar group, the polymer having a reactive group, and then introducing a double bond (polymerizable group) to the polymer by reacting the polymer with a monomer having a radical polymerizable group that reacts with the reactive group in the polymer.

Among these, from the viewpoint of synthesis suitability, method ii) or iii) is preferred.

As mentioned above, the radical polymerizable group may be introduced into the specific polymer by copolymerizing a monomer having a pendant radical polymerizable group, or may be introduced into the specific polymer by adding/substituting the radical polymerizable group to a portion of a polymer that has been previously synthesized (for example, a polymer having an ionic polar group and an interactive group).

In synthesizing the specific polymer by the above methods of i), ii) or iii), other monomer may be used as a copolymerization component in order to reduce the water absorbency of the specific polymer and improve its hydrophobic nature. Examples of the other monomer include typical radical polymerization-based monomers, such as diene monomers and acrylic monomers. Among these, an acylic monomer of an alkyl group that is not substituted is preferred, and specific examples thereof include tertiary butyl acrylate, 2-ethylhexyl acrylate, butyl acrylate, cyclohexyl acrylate, and benzyl methacrylate.

In the second embodiment of the specific polymer, the content of each unit with respect to the total amount of the copolymerization units is preferably within the following range.

Namely, the unit having an interactive group is preferably included at an amount of 5 to 80 mol %, more preferably 10 to 70 mol % with respect to the total amount of the copolymerization units, from the viewpoint of adsorbability to a plating catalyst or the like.

The unit having a radical polymerizable group is preferably included at an amount of 5 to 50 mol %, more preferably 5 to 30 mol %, with respect to the total amount of the copolymerization units, from the viewpoint of reactivity (curability or polymerizability) and suppression of gelation upon synthesis.

The unit having an ionic polar group is preferably included at an amount of 20 to 70 mol %, more preferably 20 to 60 mol %, with respect to the total amount of the copolymerization units, from the viewpoint of developabiliy with an aqueous solution and moisture-proof adhesiveness. The above content is particularly preferably 30 to 50 mol % for a better achievement of both the developability with an aqueous solution and the moisture-proof adhesiveness.

In a particularly preferable embodiment of the polymer such as the above, the content of the unit having an interactive group is 40 to 70 mol %, the content of the unit having a radical polymerizable group is 5 to 30 mol %, and the content of the unit having an ionic polar group is 20 to 50 mol %.

In a still further preferable embodiment of the specific polymer, the content of the unit having an interactive group is 40 to 60 mol %, the content of the unit having a radical polymerizable group is 10 to 20 mol %, and the content of the unit having an ionic polar group is 30 to 50 mol %.

The value of ionic polarity (an acid value when the ionic polar group is a carboxyl group) of the second embodiment of the specific polymer is preferably 1.5 to 7.0 mmol/g, more preferably 1.7 to 5.0 mmol/g, and particularly preferably 1.9 to 4.0 mmol/g. When the value of ionic polarity is within the above range, it is possible to impart the specific polymer with developability in an aqueous solution, while suppressing the reduction in adhesiveness with time under hot and humid conditions.

The optimal number of the unit and the ionic polarity value may change depending on the molecular weight of the unit having ionic polarity. In this case, optimization of the ionic polarity value to be within the above range is given priority.

However, when a polymerizable group is introduced into the polymer by reaction, e.g., in the synthesis method iii), a small amount of reactive portion may remain to form a fourth unit, if it is difficult to achieve the introduction at a ratio of 100%.

The weight average molecular weight of the second embodiment of the specific polymer is preferably 3,000 to 150,000, more preferably 5,000 to 100,000. In particular, from the viewpoint of polymerization sensitivity, the weight average molecular weight is preferably 20,000 or more.

Regarding the polymerization degree, the second embodiment of the specific polymer is preferably a 20-mer or more, more preferably a 30-mer or more. On the other hand, the second embodiment of the specific polymer is preferably a 1,500-mer or less, more preferably a 1,000-mer or less.

In any embodiment of the aforementioned specific polymer, the polymer layer preferably contain the specific polymer at an amount of 2 to 50% by mass, more preferably 5 to 30% by mass, with respect to the total amount of the composition for forming the polymer layer (at the time of application).

(Solvent)

The solvent used in the composition containing the aforementioned specific polymer is not particularly limited as long as it can dissolve a compound having an interactive group and a polymerizable group which is a main component of the composition. A surfactant may further be added to the solvent.

Examples of the solvent that may be used include alcohol solvents such as methanol, ethanol, propanol, ethylene glycol, glycerin, propylene glycol monomethyl ether, acids such as acetic acid, ketone solvents such as acetone and cyclohexanone, amide solvent such as formamide and dimethylacetoamide, and water.

The surfactant that may be added to the solvent is not particularly limited as long as it can dissolve in the solvent, and examples thereof include anionic surfactants such as sodium n-dodecylbenzene sulfonate, cationic surfactants such as n-dodecyltrimethyl ammonium chloride, and nonionic surfactants such as polyoxyethylene nonylphenol ether (commercial products thereof include EMULGEN 910, trade name, manufactured by KAO CORPORATION), polyoxyethylene sorbitan monolaurate (commercial products thereof include TWEEN 20, trade name, manufactured by KAO CORPORATION) and polyoxyethylene lauryl ether.

In the invention, the polymer layer is formed by applying a composition containing a polymer having an interactive group and a polymerizable group, and then drying the same.

The layer may be naturally dried to remove the solvent, or may be dried by heating or exposing to light.

The application amount of the polymer layer is preferably 0.1 to 10 g/m$^2$, more preferably 0.5 to 5 g/m$^2$, from the viewpoint of achieving a sufficient interaction ability with a plating catalyst or a precursor thereof, and forming a uniform layer.

(c) Application of Catalyst

In step (c), an electroless plating catalyst or a precursor thereof is applied to the polymer layer that has been formed on the primer layer and has an interaction ability with respect to the electroless plating catalyst or the precursor thereof.

<Electroless Plating Catalyst>

The electroless plating catalyst used in the invention is typically a zero-valent metal such as Pd, Ag, Cu, Ni, Al, Fe and Co. Among them, Pd and Ag are preferred in view of a favorable handling ability or a high catalytic ability. In order to fix the zero-valent metal to an interactive region, for example, a process of applying a metal colloid whose electrical charge is regulated so as to interact with the interactive group in the specific polymer may be used. In general, a metal colloid can be produced by reducing metal ions that are contained in a solution including a charged surfactant or a charged protection agent. The electrical charge of the metal colloid can be controlled by the surfactant or protective agent used herein. Since the interactive group is mainly a polar group, when the interactive group in the specific polymer is brought into interaction with the metal colloid having a regulated electrical charge, the metal colloid (electroless plating catalyst) can be selectively adsorbed to the polymer layer.

<Electroless Plating Catalyst Precursor>

The electroless plating catalyst precursor used in this step is not particularly limited as long as it turns to an electroless plating catalyst upon chemical reaction. As the electroless plating catalyst, metal ions of the aforementioned metals can be used. A metal ion (electroless plating catalyst precursor) turns to a zero-valent metal (electroless plating catalyst) through a reduction reaction. The metal ion (electroless plating catalyst precursor) may be converted to a zero-valent metal (electroless plating catalyst) by performing a separate reduction reaction after being applied to the polymer layer, but prior to immersing the polymer layer in an electroless plating bath. Alternatively, the metal ion (electroless plating catalyst precursor) may be converted to a metal (electroless plating catalyst) while being immersed in an electroless plating bath by means of a reducing agent contained therein.

Practically, the metal ion as an electroless plating catalyst precursor is applied to the polymer layer in the form of a metal salt. The metal salt to be used is not particularly limited as long as it can dissolve in an appropriate solvent and dissociate into a metal ion and a base (anion). Specific examples thereof include $M(NO_3)_n$, $MCl_n$, $M_{2/n}(SO_4)$, and $M_{3/n}(PO_4)$ (where M represents an n-valent metal atom). The resultant of the dissociation of the above-mentioned metal salt may be suitably used as the metal ion. Specific examples of the metal ion include an Ag ion, a Cu ion, an Al ion, a Ni ion, a Co ion, a Fe ion, and a Pd ion. Among them, those capable of multidentate coordination are preferred. From the viewpoints of the number of types of a functional group capable of coordination and the catalytic ability, a Pd ion is particularly preferred.

As mentioned above, by contacting the electroless plating catalyst or a precursor thereof to the polymer layer, the electroless plating catalyst or a precursor thereof can be adsorbed to the interactive group included in the polymer layer, by means of interaction due to an intermolecular force such as van der Waals' force or a coordination bond of a lone electron pair.

In view of sufficiently performing the adsorption, the concentration of the metal in a dispersion, solution or composition or the concentration of metal ion in a solution is preferably 0.001 to 50% by mass, more preferably 0.005 to 30% by mass. The contact time is preferably from 30 seconds to about 24 hours, more preferably from 1 minute to about 1 hour.

(Other Catalysts)

When electroplating is performed to the polymer layer without performing electroless plating in the subsequent step (4), a zero-valent metal may be used as the catalyst. Examples of the zero-valent metal include Pd, Ag, Cu, Ni, Al, Fe and Co. Among them, those capable of multidentate coordination are preferred. Pd, Ag and Cu are particularly preferred due to their superior adsorbability (attachability) to the interactive group (such as a cyano group) and catalytic ability.

(Organic Solvent and Water)

The plating catalyst or a precursor thereof as mentioned above is applied to the polymer layer in the form of a dispersion or a solution (catalyst solution).

The catalyst solution used in the invention contains an organic solvent or water.

By including an organic solvent in the catalyst solution, permeability of the polymer layer to the plating catalyst or a precursor thereof can be improved, and the plating catalyst or a precursor thereof can be adsorbed to the interactive group with high efficiency.

The organic solvent that may be used for the preparation of the plating catalyst solution is not particularly limited, and specific examples thereof include acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetine, diethylene glycol diacetate, dioxane, N-methylpyrrolidone, dimethyl carbonate, and dimethyl cellosolve.

Other examples of the organic solvent include diacetone alcohol, γ-butyrolactone, methanol, ethanol, isopropyl alcohol, n-propyl alcohol, propylene glycol monomethyl ether, methyl cellosolve, ethyl cellosolve, ethylene glycol tertiary butyl ether, tetrahydrofuran, 1,4-dioxane, and n-methyl-2-pyrrolidone.

In particular, from the viewpoint of compatibility with the plating catalyst or a precursor thereof, or permeability of the polymer layer to the organic solvent, acetone, dimethyl carbonate and dimethyl cellosolve are preferred.

The catalyst solution used in the invention may include water. The water preferably contains no impurity. From this point of view, RO water, deionized water, distilled water and purified water are preferred, and deionized water and distilled water are particularly preferred.

Further, the catalyst solution used in the invention may contain other additives.

Examples of the other additives include a swelling agent (for example, organic compounds such as ketone, aldehyde, ether or ester) and a surfactant (anionic surfactants, cationic surfactants, amphoteric surfactants, nonionic surfactants, low-molecular surfactants or high-molecular surfactants).

Through the aforementioned steps, interaction between the interactive group in the polymer layer and the plating catalyst or a precursor thereof can be formed.

Step (d): Formation of Metal Film

In step (d), a metal film is formed at high density on the polymer layer formed on the substrate by performing plating to the polymer layer to which an electroless plating catalyst or a precursor thereof has been applied. The obtained metal film exhibits excellent conductivity and adhesiveness.

Examples of the type of the plating that can be performed in this step include electroless plating and electroplating, which may be selected according to the functions of the plating catalyst or a precursor thereof that interacts with the polymer layer in the previous step (c).

Namely, in this step, either electroplating or electroless plating may be performed to the polymer layer to which the plating catalyst or a precursor thereof has been applied.

In the invention, electroless plating is preferably performed from the viewpoint of improving the formation of a hybrid structure that is formed in the polymer layer, and enhancing the adhesiveness. Further, in order to obtain a plating layer having a desired thickness, it is more preferable to perform electroplating after the electroless plating.

(Electroless Plating)

Electroless plating is an operation of precipitating a metal by means of chemical reaction, using a solution in which ions of the metal to be precipitated are dissolved.

The electroless plating in this step is carried out by, for example, washing the substrate to which the electroless plating catalyst has been applied with water to remove an excessive amount of electroless plating catalyst (metal), and then immersing the substrate in an electroless plating bath. A generally known electroless plating bath can be used for the electroless plating.

When immersing, in an electroless plating bath, a substrate having a polymer layer to which an electroless plating catalyst precursor has been applied such that the electroless plating catalyst precursor is adsorbed to, or impregnated in the polymer layer, the substrate is washed with water to remove an excessive amount of the precursor (metal salt or the like) prior to the immersion in the electroless plating bath. In this case, reduction of the plating catalyst precursor and the subsequent electroless plating are carried out in the electroless plating bath. In this case, a generally known electroless plating bath may also be used as the electroless plating bath.

The reduction of the electroless plating catalyst precursor may be carried out in a separate process prior to the electroless plating, by preparing a catalyst activating solution (reducing solution). The catalyst activating solution is a solution dissolving a reducing agent capable of reducing the electroless plating catalyst precursor (typically a metal ion) to a zero-valent metal, and the concentration of the reducing agent is generally in the range of 0.1% by mass to 50% by mass, and is preferably in the range of 1% to 30% by mass. Examples of the reducing agent that may be used include boron-based reducing agents such as sodium borohydride and dimethylamine borane, and reducing agents such as formaldehyde and hypophosphorous acid.

The composition of the electroless plating bath generally includes, as main components in addition to a solvent, (1) a metal ion for the plating, (2) a reducing agent, and (3) an additive that enhances the stability of the metal ion (stabilizer). The electroless plating bath may further contain a known additive such as a stabilizer for the plating bath, in addition to the above components.

Examples of the metal used in the electroless plating bath include copper, tin, lead, nickel, gold, palladium and rhodium. From the viewpoint of electrical conductivity, copper and gold are preferred.

The optimal reducing agent and additive may be selected in combination with the metal to be used. For example, the electroless plating bath of copper contains $CuSO_4$ as a copper salt, HCOH as a reducing agent, and a chelating agent that serves as a stabilizer of copper ions such as EDTA or Rochelle salt, and trialkanolamine or the like. The electroless plating bath of CoNiP contains cobalt sulfate or nickel sulfate as a metal salt, sodium hypophosphite as a reducing agent, and sodium malonate, sodium malate or sodium succinate as a complexing agent. The electroless plating bath of palladium contains $(Pd(NH_3)_4)Cl_2$ as a metal ion, $NH_3$ or $H_2NNH_2$ as a reducing agent, and EDTA as a stabilizer. These plating baths may also contain other components than the above-described components.

The thickness of the plating film formed by the electroless plating may be controlled by adjusting the concentration of the metal ion in the plating bath, the immersion time in the plating bath, the temperature of the plating bath, or the like. From the viewpoint of electroconductivity, the thickness of the plating film is preferably 0.5 μm or more, and more preferably 3 μm or more.

The immersion time in the plating bath is preferably from 1 minute to about 6 hours, and more preferably from 1 minute to about 3 hours.

By observing the cross-section with a scanning electron microscope (SEM), it can be confirmed that microparticles of the electroless plating catalyst or the plating metal are dispersed in the polymer layer at high density, and that the plating metal is precipitated on the polymer layer. Since the interface between the substrate and the plating film is in a hybrid state of the polymer and the microparticles, favorable adhesiveness can be achieved even when the interface between the substrate (organic component) and the inorganic substance (catalyst metal or plating metal) is flat and smooth (for example, the roughness is 500 nm or less).

<Electroplating>

In this step, if the plating catalyst or a precursor thereof that has been applied in step (c) functions as an electrode, electroplating may be performed to the polymer layer to which the catalyst or a precursor thereof has been applied.

It is also possible to perform electroplating after performing the above-described electroless plating, by using a plating film that has been formed in the electroless plating as an electrode. In this way, a new metal film of a desired thickness can be easily formed based on the plating film that is tightly adhered to the substrate via the polymer layer and the primer layer. Therefore, it is possible to form a metal film to a desired thickness in accordance with various applications.

The electroplating according to the invention can be performed by a conventionally known method. Examples of the metal that may be used in the electroplating include copper, chromium, lead, nickel, gold, silver, tin, and zinc. From the viewpoint of electrical conductivity, copper, gold and silver are preferred, while copper is more preferred.

The thickness of the metal film obtained by electroplating may vary according to usage, and can be controlled by adjusting the concentration of the metal contained in the plating bath, current density, or the like. In the case of typical electrical wiring or the like, the film thickness is preferably 0.5 μm or more, more preferably 3 μm or more, from the viewpoint of electrical conductivity.

In the invention, since a fractal microstructure is formed in the polymer layer from a metal or a metal salt that is derived from the above-described plating catalyst or a precursor thereof, and/or a metal that has been precipitated in the polymer layer by the electroless plating, adhesion between the metal film and the polymer layer can be further enhanced.

Regarding the amount of metal in the polymer layer, even higher adhesion can be achieved when the ratio of the metal in a portion of the polymer layer extending from the interface with the metal film to a depth of 0.5 μm is 5 to 50% by area, and the arithmetic average roughness Ra (JIS B 0633-2001, ISO 4288 (1996)) at the interface of the polymer layer and the metal film is 0.05 μm to 0.5 μm, as observed in a photograph of a cross-section of the substrate with a metal microscope.

After the above step (d), energy may be applied to the polymerizable group remaining in the primer layer or the polymer layer to cause polymerization reaction thereof, in order to enhance the adhesiveness between the metal film and the substrate via the polymer layer and the primer layer.

Energy is preferably applied by heating, in order to perform the process in a simple manner. The heating may be conducted at a temperature of 140 to 250° C. for 5 minutes to 5 hours.

The means for heating may be selected from a heating oven, thermostatic chamber, hot plate, or the like.

The amount of energy to be applied by heating can be regulated by controlling the heating temperature or heating time.

In the invention, drying is preferably performed after performing step (d) (electroless plating) and/or step (e) (electroplating).

Step (f): Drying

The drying treatment in this step may be performed by any means, and specific examples thereof include natural-drying, heat-drying, reduced-pressure drying, reduced-pressure and heating drying, and air-drying. Among these, it is preferably to perform heating at ordinary temperature or in the vicinity thereof, from the viewpoint of suppressing denaturing of the polymer layer due to drying. Specifically, the material that had been subjected to step (d) or step (e) to form a metal film is preferably dried by subjecting the same to natural drying ordinary temperature, reduced-pressure drying at ordinary temperature, or air-drying at ordinary temperature.

From the viewpoint of removing the moisture as much as possible without heating, the drying process is preferably performed for 1 hour or more, more preferably 24 hours or more. The drying conditions may be appropriately selected considering the desired degree of adhesiveness or the like. Specifically, for example, the material to which a metal film has been formed can be dried by placing the same in an environment at about 25° C. for about 1 to 3 days, about 1 to 3 weeks or about 1 to 2 months; or in an environment with reduced pressure for about 1 to 3 days or about 1 to 3 weeks together with the use of an ordinary vacuum drier.

It is not clearly known how the adhesiveness is improved by performing drying. However, it is presumed that by preventing the moisture from remaining in the metal film by drying the material to a sufficient level, degradation in adhesiveness due to the moisture can be suppressed.

Further, an antioxidant is preferably applied to the surface of the metal film in order to prevent oxidization of the surface of the metal film formed from copper or the like, during the drying process. Known antioxidants, such as azimidobenzene, may be used in the invention.

(Method of Forming Metal Pattern)

A metal pattern can be formed using the method of forming a metal film of the invention by forming a plating receiving layer in a patterned manner by applying energy to a portion of the polymer layer to cure, during the formation of the polymer layer or after the formation of the polymer layer in step (b), and then removing the uncured portion by developing. The metal pattern can also be formed by removing unnecessary portions of the metal film by etching the same that is formed on the entire surface of the substrate. Alternatively, the metal pattern can be formed by forming the primer layer in a patterned manner in step (a) by a known method such as printing.

In order to form a pattern by applying energy, the energy is applied to the primer layer or the polymer layer formed on the primer layer in a patterned manner by heating or irradiating with radiation rays such as light. For example, light irradiation with a UV lamp or visible rays or heating by a hot plate is applicable. Examples of the light source include a mercury lamp, a metal halide lamp, a xenon lamp, a chemical lamp, and a carbon arc lamp. Examples of the radiation rays include electron beams, X rays, ion beams, and far infrared rays. Further, g-line rays, i-line rays, Deep-UV light, high-density energy beams (laser beams) are also applicable.

Specific embodiments of the typical energy application include direct image-wise recording using a thermal recording head or the like, scanning exposure with infrared laser beams, high-illumination flash exposure with a xenon discharge lamp via a mask, or exposure with an infrared lamp.

The time for applying energy may vary depending on the level of desired strength of the polymer layer or the type of light source, but is typically 10 seconds to 5 hours.

When energy is applied by light, the amount of the same is preferably 10 to 5,000 $mJ/cm^2$, more preferably 50 to 3,000 $mJ/cm^2$, from the viewpoint of promoting the polymerization reaction or suppressing the decomposition of the polymer layer in which a crosslinking structure has been formed.

Further, by selecting the specific polymer having a weight average molecular weight of 20,000 or more and a polymerization degree of 200-mer or more, decomposition of the cured polymer layer can be further suppressed since polymerization reaction can be promoted even when light exposure is conducted at low energy.

After applying energy in a patterned manner, the polymer at an uncured portion is removed by performing development. The development can be conducted by a method of thoroughly washing the material with saturated sodium bicarbonate water, or a method of thoroughly washing the material with an alcohol solvent such as methanol.

By performing the aforementioned steps (c) and (d) to the substrate having the thus obtained patterned polymer layer, a metal film is formed only at a portion of the polymer layer that is receptive to a plating catalyst and is capable of interacting with the plating catalyst, thereby obtaining a metal pattern.

When a pattern is formed by etching, the etching may be performed by any known method that is used in producing printed circuit boards, such as wet etching or dry etching. The etching method can be arbitrarily selected. In view of operability, a wet etching apparatus is simple and preferred. The etching solution may be an aqueous solution of copper chloride, ferric chloride or the like.

As mentioned above, the metal film obtained by the method of invention is formed on the polymer layer that is tightly adhered to the substrate via the primer layer, while forming a portion in a hybrid state of the metal and the polymer between the metal film and the polymer layer. Therefore, the metal film exhibits excellent adhesiveness with respect to the substrate and excellent smoothness at an interface with the substrate. Accordingly, the metal pattern formed from the metal film obtained according to the method of the invention is applicable as an electrical conducting material for a wide range of applications due to its superior high-frequency characteristics.

The following are preferable embodiments of the invention. However, the invention is not limited thereto.

1. A method of forming a metal film, the method comprising:
    (a) forming a primer layer on a substrate by applying a first polymer including a unit having a cyano group in a side chain;
    (b) forming a polymer layer on the surface of the primer layer by applying a second polymer, the second polymer having a functional group that interacts with an electroless plating catalyst or a precursor thereof and a polymerizable group;
    (c) applying the electroless plating catalyst or the precursor thereof to the polymer layer; and
    (d) forming a metal film on the polymer layer by performing electroless plating.
2. The method of forming a metal film according to <1>, further comprising (e) performing electroplating after the electroless plating.
3. The method of forming a metal film according to <1>, further comprising applying energy in a patterned manner to the polymer layer formed in step (b) and developing the polymer layer.

4. The method of forming a metal film according to <1>, further comprising applying energy to the metal film formed in step (d).

5. The method of forming a metal film according to <1>, wherein the first polymer comprises a polymer including a unit represented by the following formula (1):

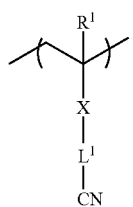
(1)

wherein in formula (1), $R^1$ represents a hydrogen atom or an alkyl group that may be substituted or unsubstituted; X represents a single bond, a divalent organic group that may be substituted or unsubstituted, an ester group, an amide group, or an ether group; and $L^1$ represents a divalent organic group that may be substituted or unsubstituted.

6. The method of forming a metal film according to <1>, wherein the second polymer comprises a copolymer including a unit represented by the following formula (a) and a unit represented by the following formula (b):

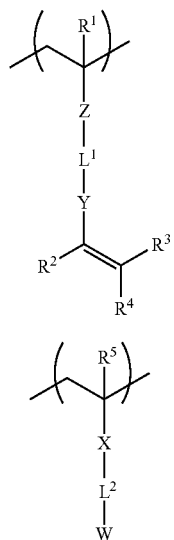
(a)

(b)

wherein in formula (a) and formula (b), $R^1$ to $R^5$ each independently represent a hydrogen atom or an alkyl group that may be substituted or unsubstituted; X, Y and Z each independently represent a single bond, a divalent organic group that may be substituted or unsubstituted, an ester group, an amide group or an ether group; $L^1$ and $L^2$ each independently represent a divalent organic group that may be substituted or unsubstituted; and W represents a functional group that interacts with the electroless plating catalyst or the precursor thereof.

7. The method of forming a metal film according to <1>, wherein the second polymer comprises a third polymer having a non-dissociative functional group that interacts with an electroless plating catalyst or a precursor thereof, a radical polymerizable group, and an ionic polar group.

8. The method of forming a metal film according to <7>, wherein the third polymer comprises a copolymer including a unit represented by the following formula (A), a unit represented by the following formula (B), and a unit represented by the following formula (C).

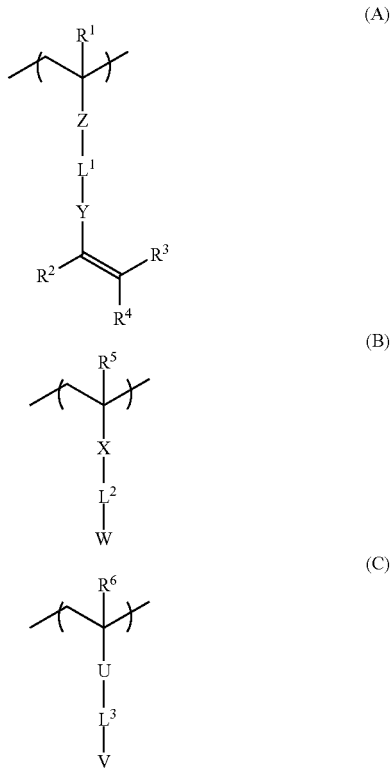

wherein in formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a divalent organic group that may be substituted or unsubstituted; W represents a non-dissociative functional group that interacts with the electroless plating catalyst or the precursor thereof; and V represents an ionic polar group.

9. The method of forming a metal film according to <1>, wherein the application amount of the primer layer is from 0.1 mg/m$^2$ to 10 mg/m$^2$ in terms of solid content of the polymer including a unit having a cyano group in a side chain.

10. The method of forming a metal film according to <1>, wherein the polymer layer comprises a portion containing particles of at least one of the electroless plating catalyst or a metal that has been precipitated by the electroless plating, the portion extending from the interface of the polymer layer and the metal film to a depth of 0.05 μm or more in a direction toward the substrate.

11. The method of forming a metal film according to <1>, wherein the polymer layer comprises a portion containing, in an amount of 25% by volume or more, particles of at least one of the electroless plating catalyst or a metal that has been precipitated by the electroless plating, the portion being in the vicinity of the interface of the metal film and the polymer layer.

12. The method of forming a metal film according to <1>, wherein the substrate has a surface roughness of 500 nm or less.

EXAMPLES

In the following, the invention is described in further details with reference to the Examples. However, the invention is not limited thereto.

<Substrate>

A polyimide film (KAPTON 500H, manufactured by DUPONT-TORAY CO., LTD.) was used as the substrate.

Formation of Primer Layer

Primer layer coating composition 1 was prepared by mixing and stirring the following compounds. Primer layer 1 was formed by applying primer layer coating composition 1 onto the polyimide film by a spin coating method to a thickness of 1 μm, and then drying the same at 60° C. for 30 minutes.

<Primer Layer Coating Composition 1>

| | |
|---|---|
| Cyano group-containing polymer 1 (following structure) (content of cyano group: 1.9 mmol/g, weight average molecular weight: 130,000) | 10 parts by mass |
| 1,3-dioxolan | 90 parts by mass |

Cyano group-containing polymer 1

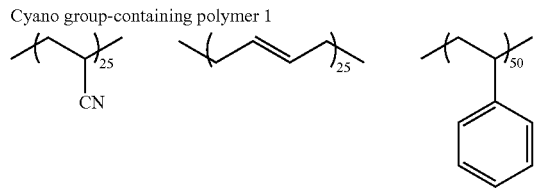

Synthesis of Polymer Having Interactive Group, Radical Polymerizable Group and Ionic Polar Group (Specific Polymer)

(Synthesis of Specific Polymer 1)

20 g of N,N-dimethyl acetoamide were placed in a 500 ml three-neck flask, and were heated to 65° C. under a nitrogen stream. Then, 20.7 g of monomer M having the following structure, 20.5 g of 2-cyanoethyl acrylate (manufactured by TOKYO CHEMICAL INDUSTRY CO., Ltd.), 14.4 g of acrylic acid (manufactured by TOKYO CHEMICAL INDUSTRY CO., LTD.), and 20 g of a N,N-dimethyl acetoamide solution containing 1.0 g of V-65 (manufactured by WAKO PURE CHEMICAL INDUSTRIES LTD.) were dropped in the flask over four hours. After the dropping, the content of the flask was stirred for further three hours. Thereafter, 91 g of N,N-dimethyl acetoamide were added into the flask and the reaction solution was cooled to room temperature.

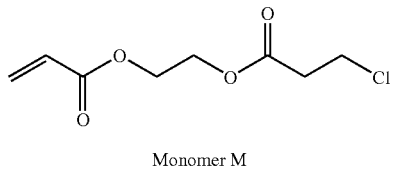

Monomer M

To the above reaction solution, 0.17 g of 4-hydroxy TEMPO (manufactured by TOKYO CHEMICAL INDUSTRY CO., LTD.) and 75.9 g of triethylamine were added, and the reaction solution was further allowed to react at room temperature for hour hours. Thereafter, 112 g of an aqueous solution containing 70% by mass of methanesulfonic acid was added to the reaction solution. After the completion of reaction, re-precipitation was performed with water to recover a solid. 25 g of specific polymer 1 (weight average molecular weight: 74,000) having the following structure were thus obtained.

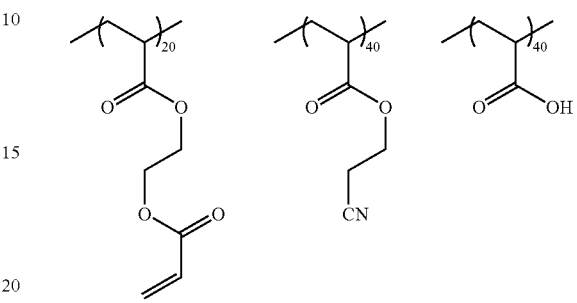

Specific polymer 1

Example 1

Polymer layer coating composition 1 was prepared by mixing and stirring 0.2 g of specific polymer 1, 0.03 g of sodium carbonate and 1.8 g of water. Polymer layer coating composition 1 was applied onto primer layer 1 that has been formed on the substrate, by a spin coating method to a thickness of 1 μm, and was dried at 80° C. for 30 minutes.

Then, the polymer layer was irradiated with UV rays at an intensity of 23 mW/cm$^2$ for 300 seconds with a UV exposure apparatus (model number: UVX-02516S1LP01, manufactured by USHIO INC.) Thereafter, the substrate was immersed in an aqueous solution containing 1% by mass of Na$_2$CO$_3$ for 5 minutes, and was washed with distilled water. Substrate A having a polymer layer formed from specific polymer 1 on the entire surface of primer layer 1 was thus obtained.

(Application of Plating Catalyst)

Substrate A having a polymer layer (layer to be subjected to plating) was immersed in an aqueous solution containing 10% by mass of silver nitrate for 10 minutes. Then, the substrate was washed by immersing in acetone.

(Electroless Plating and Electroplating>

Substrate A having polymer layer 1 to which a plating catalyst has been applied was subjected to electroless plating at 26° C. for 10 minutes, using an electroless plating bath having the following composition. The thickness of the obtained copper electroless plating film was 0.3 μm.

<Composition of Electroless Plating Bath>

| | |
|---|---|
| Distilled water | 774 g |
| ATS ADCOPPER IW-A (manufactured by OKUNO CHEMICAL INDUSTRIES, CO., LTD.) | 45 mL |
| ATS ADCOPPER IW-M (manufactured by OKUNO CHEMICAL INDUSTRIES, CO., LTD.) | 72 mL |
| ATS ADCOPPER IW-C (manufactured by OKUNO CHEMICAL INDUSTRIES, CO., LTD.) | 9 mL |
| NaOH | 1.98 g |
| 2,2'-bipyridyl | 1.8 mg |

Subsequently, electroplating was performed at 3 A/dm² for 20 minutes, using the copper electroless plating film obtained above as a feed layer, in a copper electroplating bath having the following composition. Metal film 1 (a copper electroplating film) having a thickness of 18 μm was thus obtained.

<Composition of Electroplating Bath>

| | |
|---|---|
| Copper sulfate | 38 g |
| Sulfuric acid | 95 g |
| Hydrochloric acid | 1 mL |
| COPPER GLEAM (manufactured by MELTEX INC.) | 3 mL |
| Water | 500 g |

Example 2

Metal film 2 having a thickness of 18 μm was obtained in a similar manner to Example 1, except that primer layer 2 was formed on the substrate using cyano group-containing polymer 2 (following structure) instead of cyano group-containing polymer 1 used for primer layer 1. The content of the cyano group in cyano group-containing polymer 2 was 7.2 mmol/g and the weight average molecular weight of the same as measured by a GPC method was 92,000.

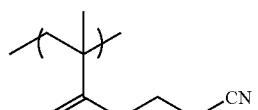

Cyano group-containing polymer 2

Example 3

Synthesis of Polymer Having Interactive Group and Polymerizable Group (Synthesis of Specific Polymer 2)

200 g of N,N-dimethyl acetoamide, 30 g of polyacrylic acid (manufactured by WAKO PURE CHEMICAL INDUSTRIES LTD., molecular weight: 25,000), 0.9 g of 2-ethyl-4-ethyl-imidazole, 25 mg of ditertiary pentyl hydroquinone and 27 g of monomer B (following structure) were placed in a 500-ml three-neck flask, and were allowed to react at 100° C. for 5 hours under a nitrogen stream.

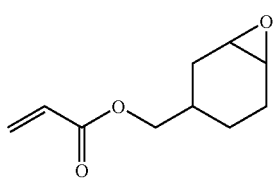

Monomer B

Thereafter, 11.6 ml of 4NNaOH were added to 50 g of the above reaction solution while cooling with ice, and re-precipitation was performed with ethyl acetate to recover a solid. The solid was filtered, washed with distilled water and dried, thereby obtaining 2.7 g of specific polymer 2 having the following structure (weight average molecular weight: 67,000).

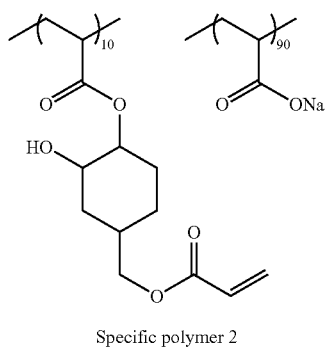

Specific polymer 2

0.25 g of specific polymer 2 obtained above and 3.0 g of methanol were mixed to prepare polymer layer coating composition 2. Polymer layer coating composition 2 was applied to primer layer 1 that has been formed on the substrate as prepared in Example 1, to a thickness of 1 μm by a spin coating method, and was then dried at 80° C. for 30 minutes.

Subsequently, the applied coating composition was irradiated with UV rays using a UV exposure apparatus (model number: UVF-502S, lamp: UXM-501 MD, manufactured by SAN-El ELECTRONIC CO., LTD.) at an intensity of 1.5 mW/cm² for 280 seconds. The intensity was measured by a UV-ray integrated light intensity meter (trade name: UIT 150, manufactured by USHIO INC.) equipped with a light-receiving sensor (trade name: UVD-S254, manufactured by USHIO INC.) Thereafter, the obtained film was washed with saturated sodium bicarbonate water, and polymer layer 2 was formed on the entire surface of primer layer 1 formed on the substrate, thereby obtaining substrate B having a polymer layer formed from specific polymer 2 on the entire surface thereof. The integrated exposure amount in this process was 420 mJ/cm².

Electroless Plating and Electroplating

The thus obtained substrate B was immersed in an aqueous solution containing 1% by mass of silver nitrate (manufactured by WAKO PURE CHEMICAL INDUSTRIES LTD.) for 5 minutes, and was then washed with distilled water. Thereafter, a metal film was formed on the substrate by performing electroless plating for 20 minutes using an electroless plating bath having the following composition.

<Composition of Electroless Plating Bath>

| | |
|---|---|
| Distilled water | 176 g |
| Copper sulfate•pentahydrate | 1.9 g |
| EDTA•2Na | 5.54 g |
| NaOH | 1.58 g |
| PEG (molecular weight: 1,000) | 0.019 g |
| 2,2'-bipyridyl | 0.18 mg |
| Formaldehyde aqueous solution | 1.01 g |

Subsequently, the metal film was further subjected to electroplating for 20 minutes using an electroplating bath having the following composition. Metal film 3 having a thickness of 18 μm was thus formed.

<Composition of Electroplating>

| | |
|---|---|
| Copper sulfate•pentahydrate | 135 g |
| Concentrated sulfuric acid | 342 g |
| Hydrochloric acid | 0.25 g |

-continued

| | |
|---|---|
| COPPER GLEAM ST-901C (trade name, manufactured by ROHM AND HAAS ELECTRONIC MATERIALS) | 9 mL |
| Water | 234 g |

Comparative Example 1

A metal film having a thickness of 18 µm was obtained in a similar manner to Example 1, except that primer layer 3 was formed on the substrate using a poly(styrene-butadiene) copolymer (copolymerization ratio: 55/45, Mw: 200,000) as a comparative polymer instead of cyano group-containing polymer 1.

Comparative Example 2

A metal film having a thickness of 18 µm was obtained in a similar manner to Example 1, except that primer layer 4 was formed on the substrate using a polystyrene (Mw: 170,000) as a comparative polymer instead of cyano group-containing polymer 1.

Comparative Example 3

A metal film having a thickness of 18 µm was obtained in a similar manner to Example 1, except that primer layer 5 was formed on the substrate using a polybutadiene (Mw: 290,000) as a comparative polymer instead of cyano group-containing polymer 1.

<Evaluation>

(Adhesiveness)

Adhesion of the metal film obtained in Examples 1 to 3 and Comparative Examples 1 to 3 was evaluated. Specifically, whether the metal film was peeled from the substrate was observed by naked eye in accordance with a cross cut test method based on JIS K 5600. The less the degree of peeling is, the more the adhesiveness of metal film is. When the result is any of A, B or C of the following criteria, the metal film is considered to have adhesiveness of a sufficient degree for practical applications. The results are shown in Table 1.

TABLE 1

| | Polymer for primer layer | Polymer for polymer layer | Cross cut test |
|---|---|---|---|
| Ex. 1 | Cyano group-containing polymer 1 | Specific polymer 1 | A |
| Ex. 2 | Cyano group-containing polymer 2 | Specific polymer 1 | A |
| Ex. 3 | Cyano group-containing polymer 1 | Specific polymer 2 | B |
| Com. Ex. 1 | Styrene-butadiene copolymer | Specific polymer 1 | D |
| Com. Ex. 2 | Polystyrene | Specific polymer 1 | D |
| Com. Ex. 3 | Polybutadiene | Specific polymer 1 | D |

A: No peeling was observed.
B: Peeling was observed at 1 to 10 squares/100 squares
C: Peeling was observed at 11 to 49 squares/100 squares
D: Peeling was observed at 50 squares or more/100 squares As shown in Table 1, the metal films obtained in Examples 1 to 3 exhibited superior adhesiveness to the substrate as compared with the metal films obtained in Comparative Examples 1 to 3. The reason for this is considered to be that the primer layers of Examples 1 to 3 improve the adhesiveness between the substrate and the polymer layer, as compared with the primer layers of Comparative Examples 1 to 3 formed from polymers that are similar to that of Examples 1 to 3 but include no cyano group-containing unit.

Example 4

Formation of Pattern of Specific Polymer 1

A coating composition was prepared using specific polymer 1 in a similar manner to Examples 1. A coating film was formed by applying the coating composition to a substrate having a primer layer formed from cyano group-containing polymer 1 thereon, which is the same as that used in Example 1, to a thickness of 1 µm and then drying the same at 80° C. for 5 minutes.

Thereafter, mask A including patterns of 5 mm in width and 50 mm in length that were aligned at an interval of 0.1 mm was placed on the coating film. Then, the coating film was irradiated with UV rays via the mask using a UV ray exposure unit (model number: UVF-502S, lamp: UXM-501 MD, manufactured by SAN-El ELECTRONIC CO., LTD.) at an intensity of 10 mW/cm$^2$ for 100 seconds. The intensity was measured by a UV-ray integrated light intensity meter (trade name: UIT 150, manufactured by USHIO INC.) equipped with a light-receiving sensor (trade name: UVD-S254, manufactured by USHIO INC.) In this way, the coating film formed from specific polymer 1 was cured in a patterned manner on the primer layer of the substrate.

Then, the substrate was immersed in saturated sodium bicarbonate water while stirring for 5 minutes, and was then washed with distilled water. A polymer layer having a pattern of 5 mm in width and 50 mm in length, and has a thickness of 0.5 µm was thus obtained.

Subsequently, electroless plating and electroplating were performed to the substrate on which the patterned polymer layer has been formed, in a similar manner to Example 1. A metal film having a pattern of 5 mm in width and 50 mm in length was thus obtained.

(Evaluation of Adhesiveness)

Adhesiveness of the obtained patterned metal film was evaluated in accordance with a cross cut test method in the same manner as Examples 1 to 3. As a result, no peeling was observed and excellent adhesiveness was achieved.

Example 5

A layer of specific polymer 1 was formed in a patterned manner on the primer layer of the substrate and was cured in accordance with Example 4, except that mask B having a comb-shaped wiring pattern of line-and-space (L/S)=100 µm/100 µm was used instead of mask A.

The substrate was immersed in saturated sodium bicarbonate water while stirring for 5 minutes, and was washed with distilled water. A substrate having a layer of specific polymer 1 having a comb-shaped wiring pattern of L/S=100 µm/100 µm and a thickness of 0.5 µm was thus obtained.

Using the above substrate having a patterned polymer layer, electroless plating and electroplating were performed in a similar manner to Examples 1 to 3. A metal film having a pattern of L/S=100 µm/100 µm was thus formed on the substrate.

Adhesiveness of the obtained patterned metal film was evaluated in accordance with a cross cut test method in the same manner as mentioned above. As a result, no peeling was observed and excellent adhesiveness was achieved.

As shown in the results of Examples 4 and 5, by forming a polymer layer in a patterned manner according to the method of forming a metal film of the invention, a metal film of an arbitrary pattern that exhibits excellent adhesiveness with respect to the substrate may be easily formed.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of forming a metal film, the method comprising:
    (a) forming a primer layer on a substrate by applying a first polymer including a unit having a cyano group in a side chain;
    (b) forming a polymer layer on the surface of the primer layer by applying a second polymer, the second polymer having a functional group that interacts with an electroless plating catalyst or a precursor thereof and a polymerizable group;
    (c) applying the electroless plating catalyst or the precursor thereof to the polymer layer; and
    (d) forming a metal film on the polymer layer by performing electroless plating,
    wherein the first polymer comprises a polymer including a unit represented by the following formula (1):

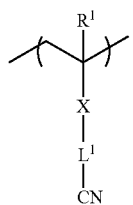

(1)

wherein in formula (1), $R^1$ represents a hydrogen atom or an alkyl group that may be substituted or unsubstituted; X represents a single bond, a divalent organic group that may be substituted or unsubstituted, an ester group, an amide group, or an ether group; and $L^1$ represents a divalent organic group that may be substituted or unsubstituted.

2. The method of forming a metal film according to claim 1, further comprising (e) performing electroplating after the electroless plating.

3. The method of forming a metal film according to claim 1, further comprising applying energy in a patterned manner to the polymer layer formed in step (b) and developing the polymer layer.

4. The method of forming a metal film according to claim 1, further comprising applying energy to the metal film formed in step (d).

5. The method of forming a metal film according to claim 1, wherein the second polymer comprises a copolymer including a unit represented by the following formula (a) and a unit represented by the following formula (b):

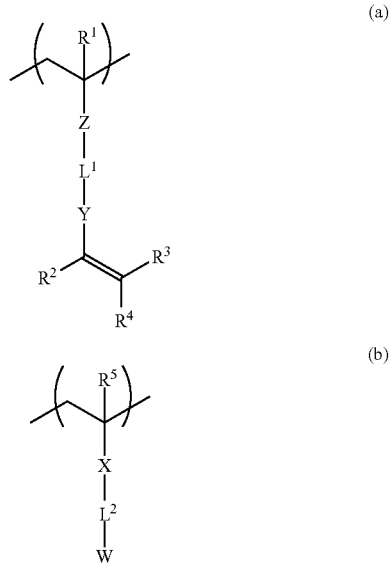

wherein in formula (a) and formula (b), $R^1$ to $R^5$ each independently represent a hydrogen atom or an alkyl group that may be substituted or unsubstituted; X, Y and Z each independently represent a single bond, a divalent organic group that may be substituted or unsubstituted, an ester group, an amide group or an ether group; $L^1$ and $L^2$ each independently represent a divalent organic group that may be substituted or unsubstituted; and W represents a functional group that interacts with the electroless plating catalyst or the precursor thereof.

6. The method of forming a metal film according to claim 1, wherein the second polymer comprises a third polymer having a non-dissociative functional group that interacts with an electroless plating catalyst or a precursor thereof, a radical polymerizable group, and an ionic polar group.

7. The method of forming a metal film according to claim 6, wherein the third polymer comprises a copolymer including a unit represented by the following formula (A), a unit represented by the following formula (B), and a unit represented by the following formula (C).

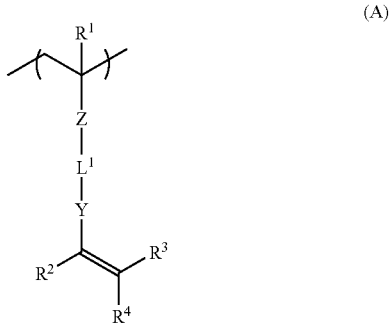

-continued

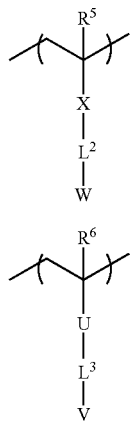

wherein in formulae (A) to (C), $R^1$ to $R^6$ each independently represent a hydrogen atom or an alkyl group that may be substituted or unsubstituted; X, Y, Z and U each independently represent a single bond, a divalent organic group that may be substituted or unsubstituted, an ester group, an amide group or an ether group; $L^1$, $L^2$ and $L^3$ each independently represent a divalent organic group that may be substituted or unsubstituted; W represents a non-dissociative functional group that interacts with the electroless plating catalyst or the precursor thereof; and V represents an ionic polar group.

8. The method of forming a metal film according to claim 1, wherein the application amount of the primer layer is from 0.1 mg/m$^2$ to 10 mg/m$^2$ in terms of solid content of the polymer including a unit having a cyano group in a side chain.

9. The method of forming a metal film according to claim 1, wherein the polymer layer comprises a portion containing particles of at least one of the electroless plating catalyst or a metal that has been precipitated by the electroless plating, the portion extending from the interface of the polymer layer and the metal film to a depth of 0.05 μm or more in a direction toward the substrate.

10. The method of forming a metal film according to claim 1, wherein the polymer layer comprises a portion containing, in an amount of 25% by volume or more, particles of at least one of the electroless plating catalyst or a metal that has been precipitated by the electroless plating, the portion being in the vicinity of the interface of the metal film and the polymer layer.

11. The method of forming a metal film according to claim 1, wherein the substrate has a surface roughness of 500 nm or less.

* * * * *